(12) United States Patent
Morishita

(10) Patent No.: US 12,501,832 B2
(45) Date of Patent: *Dec. 16, 2025

(54) PIEZOELECTRIC THIN FILM, PIEZOELECTRIC THIN FILM ELEMENT, AND PIEZOELECTRIC TRANSDUCER

(71) Applicant: TDK Corporation, Tokyo (JP)

(72) Inventor: Junpei Morishita, Tokyo (JP)

(73) Assignee: TDK Corporation, Tokyo (JP)

( * ) Notice: Subject to any disclaimer, the term of this patent is extended or adjusted under 35 U.S.C. 154(b) by 961 days.

This patent is subject to a terminal disclaimer.

(21) Appl. No.: 17/683,960

(22) Filed: Mar. 1, 2022

(65) Prior Publication Data

US 2022/0367785 A1 Nov. 17, 2022

(30) Foreign Application Priority Data

Mar. 9, 2021 (JP) ................................ 2021-037452

(51) Int. Cl.
*H10N 30/00* (2023.01)
*H10N 30/50* (2023.01)
*H10N 30/853* (2023.01)

(52) U.S. Cl.
CPC .......... *H10N 30/708* (2024.05); *H10N 30/50* (2023.02); *H10N 30/8536* (2023.02)

(58) Field of Classification Search
CPC .......... H10N 30/8542; H10N 30/8561; H10N 30/853; H10N 30/8536; H10N 30/50;

(Continued)

(56) References Cited

U.S. PATENT DOCUMENTS

2008/0089832 A1 4/2008 Aoki et al.
2020/0227621 A1 7/2020 Morishita (Continued)

FOREIGN PATENT DOCUMENTS

| CN | 111435699 A | 7/2020 |
| JP | 2013-191870 A | 9/2013 |
| WO | 2019/093471 A1 | 5/2019 |

OTHER PUBLICATIONS

Yazawa, Keisuke et al., "Composition dependence of crystal structure and electrical properties for epitaxial films of $Bi(Zn_{1/2}Ti_{1/2})O_3$—$BiFeO_3$ solid solution system," Journal of the Ceramic Society of Japan, (2010) Aug. 31, 2010, pp. 660-661.

(Continued)

*Primary Examiner* — J. San Martin
(74) *Attorney, Agent, or Firm* — Faegre Drinker Biddle & Reath LLP

(57) ABSTRACT

A piezoelectric thin film includes a first piezoelectric layer and a second piezoelectric layer directly stacked on the first piezoelectric layer. The first piezoelectric layer contains a tetragonal crystal 1 of a perovskite-type oxide. The second piezoelectric layer contains a tetragonal crystal 2 of a perovskite-type oxide. A (001) plane of the tetragonal crystal 1 is oriented in a normal direction do of a surface of the piezoelectric thin film. A (001) plane of the tetragonal crystal 2 is oriented in the normal direction dn of the surface of the piezoelectric thin film. An interval of the (001) plane of the tetragonal crystal 1 is c1, an interval of a (100) plane of the tetragonal crystal 1 is a1, an interval of the (001) plane of the tetragonal crystal 2 is c2, an interval of a (100) plane of the tetragonal crystal 2 is a2, c2/a2 is more than c1/a1 and c1/a1 is from 1.015 to 1.050.

12 Claims, 4 Drawing Sheets

(58) Field of Classification Search
CPC .... H10N 30/708; H10N 30/704; H04R 17/00; H04R 17/02; B06B 1/06; C23C 14/08
See application file for complete search history.

(56) References Cited

U.S. PATENT DOCUMENTS

| | | | |
|---|---|---|---|
| 2020/0357978 A1 | 11/2020 | Kijima et al. | |
| 2021/0305485 A1* | 9/2021 | Morishita | H10N 30/076 |
| 2022/0059753 A1* | 2/2022 | Sato | H10N 30/076 |
| 2023/0292621 A1* | 9/2023 | Morishita | H10N 30/8561 |
| 2024/0224808 A1* | 7/2024 | Sato | B06B 1/0666 |

OTHER PUBLICATIONS

K. Ujimoto, T. Yoshimura, A. Ashida, and N. Fujimura, "Direct piezoelectric properties of (100) and (111) $BiFeO_3$ epitaxial thin films," Applied Physics Letters 100, American Institute of Physics, Mar. 6, 2012, p. 102901-1-p. 102901-3.

\* cited by examiner

PIEZOELECTRIC THIN FILM, PIEZOELECTRIC THIN FILM ELEMENT, AND PIEZOELECTRIC TRANSDUCER

TECHNICAL FIELD

The present disclosure relates to a piezoelectric thin film, a piezoelectric thin film element, and a piezoelectric transducer.

BACKGROUND

A piezoelectric material is processed into various piezoelectric elements in correspondence with various purposes. For example, a piezoelectric actuator converts a voltage into a force due to a reverse piezoelectric effect of deforming the piezoelectric material by applying a voltage to the piezoelectric material. In addition, a piezoelectric sensor converts a force into a voltage due to a piezoelectric effect of deforming the piezoelectric material by applying a pressure to the piezoelectric material. The piezoelectric elements are mounted on various electronic devices.

In recent years, since a reduction in size and an improvement of performance of electronic devices are required, a piezoelectric element (piezoelectric thin film element) using a piezoelectric thin film has been actively researched. However, the thinner the piezoelectric material is, the further the piezoelectric effect and the reverse piezoelectric effect are less likely to be obtained. Therefore, development of a piezoelectric material having excellent piezoelectric properties in a thin film state is expected.

in the related art, lead zirconate titanate (so-called PZT) that is a perovskite-type ferroelectric material has been widely used as the piezoelectric material. However, PZT contains lead that is harmful to a human body and an environment, and thus development of lead-free piezoelectric material as an alternative to PZT is expected. For example, in "K. Ujimoto et al, Direct piezoelectric properties of (100) and (111) $BiFeO_3$ epitaxial thin films, APPLIED PHYSICS LETTERS. 100, 102901 (2012)", $BiFeO_3$ is disclosed as an example of the lead-free piezoelectric material. $BiFeO_3$ has relative excellent piezoelectric properties among lead-free piezoelectric materials, and is particularly expected for application to the piezoelectric thin film element. Japanese Unexamined Patent Publication No. 2013-191870 discloses a piezoelectric material which is composed of $Bi(Co, Fe)O_3$, and in which a tetragonal crystal and a rhombohedral crystal are mixed as a piezoelectric material having more excellent piezoelectric properties in comparison to $BiFeO_3$ of the related art.

SUMMARY $(-e_{31,f})^2/\varepsilon_0\varepsilon_r$ is a piezoelectric performance index indicating piezoelectric properties of a piezoelectric thin film. $-e_{31,f}$ is a kind of a piezoelectric constant and a unit of $-e_{31,f}$ is $C/m^2$. $\varepsilon_0$ represents permittivity of vacuum and a unit of $\varepsilon_0$ is $F/m$. $\varepsilon_r$ represents relative permittivity of a piezoelectric thin film, and there is no unit of $\varepsilon_r$. A unit of $(-e_{31,f})^2/\varepsilon_0\varepsilon_r$ is Pa. A piezoelectric thin film having a large piezoelectric performance index is suitable for a piezoelectric thin film element such as a piezoelectric transducer (sensor). However, the piezoelectric material of the related art in which the tetragonal crystal and the rhombohedral crystal are mixed is excellent in the piezoelectric properties, but the piezoelectric material has relatively high relative permittivity. Therefore, the piezoelectric material does not have a sufficiently large piezoelectric performance index. Accordingly, the piezoelectric material in the related art is not sufficiently suitable for a piezoelectric thin film element such as a piezoelectric transducer (sensor).

An object of an aspect of the present invention is to provide a piezoelectric thin film having a large piezoelectric performance index, a piezoelectric thin film element including the piezoelectric thin film, and a piezoelectric transducer.

According to an aspect of the present invention, there is provided a piezoelectric thin film including: a first piezoelectric layer; and a second piezoelectric layer that is directly stacked on the first piezoelectric layer. The first piezoelectric layer contains a tetragonal crystal 1 of a perovskite-type oxide, the second piezoelectric layer contains a tetragonal crystal 2 of a perovskite-type oxide, a (001) plane of the tetragonal crystal 1 is oriented in a normal direction of a surface of the piezoelectric thin film, a (001) plane of the tetragonal crystal 2 is oriented in the normal direction of the surface of the piezoelectric thin film, an interval of the (001) plane of the tetragonal crystal 1 is set as c1, an interval of a (100) plane of the tetragonal crystal 1 is set as a1, an interval of the (001) plane of the tetragonal crystal 2 is set as c2, an interval of a (100) plane of the tetragonal crystal 2 is set as a2, c2/a2 is more than c1/a1, and c1/a1 is from 1.015 to 1.050.

c2/a2 may be from 1.051 to 1.250.

A peak intensity of a diffracted X-ray deriving from the (001) plane of the tetragonal crystal 1 is set as $I_1$, a peak intensity of a diffracted X-ray deriving from the (001) plane of the tetragonal crystal 2 is set as $I_2$, and $I_2/(I_1+I_2)$ may be 0.90 or more and less than 1.00.

The perovskite-type oxide may contain bismuth, iron, an element $E^B$, and oxygen, and the element $E^B$ may be at least one kind of element selected from the group consisting of magnesium, aluminum, zirconium, titanium, nickel, and zinc.

The tetragonal crystal 1 may be expressed by the following chemical formula 1, $E^A$ in the following chemical formula 1 may be at least one kind of element selected from the group consisting of Na, K, and Ag, $E^B$ in the following chemical formula 1 may be at least one kind of element selected from the group consisting of Mg, Al, Zr, Ti, Ni, and Zn, x1 in the following chemical formula 1 may be from 0.10 to 0.90, y1 in the following chemical formula 1 may be from 0.05 to 0.85, z1 in the following chemical formula 1 may be from 0.05 to 0.85, x1+y1+z1 may be 1.00, and α in the following chemical formula 1 may be 0.00 or more and less than 1.00.

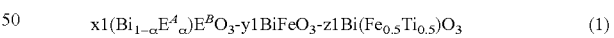

$$x1(Bi_{1-\alpha}E^A_\alpha)E^BO_3\text{-}y1BiFeO_3\text{-}z1Bi(Fe_{0.5}Ti_{0.5})O_3 \quad (1)$$

The tetragonal crystal 2 may be expressed by the following chemical formula 2, $E^A$ in the following chemical formula 2 may be at least one kind of element selected from the group consisting of Na, K, and Ag, $E^B$ in the following chemical formula 2 may be at least one kind of element selected from the group consisting of Mg, Al, Zr, Ti, Ni, and Zn, x2 in the following chemical formula 2 may be from 0.10 to 0.85, y2 in the following chemical formula 2 may be from 0.10 to 0.85, z2 in the following chemical formula 2 may be from 0.05 to 0.80, x2+y2+z2 may be 1.00, and α in the following chemical formula 2 may be 0.00 or more and less than 1.00.

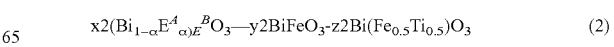

$$x2(Bi_{1-\alpha}E^A_\alpha)E^BO_3\text{—}y2BiFeO_3\text{-}z2Bi(Fe_{0.5}Ti_{0.5})O_3 \quad (2)$$

The thickness of the first piezoelectric layer may be from 10 nm to 300 nm.

According to another aspect of the present invention, there is provided a piezoelectric thin film element including the piezoelectric thin film.

The piezoelectric thin film element according to the aspect of the present invention may include a single crystal substrate; an electrode layer that is stacked on the single crystal substrate, and the piezoelectric thin film that is stacked on the electrode layer, a first intermediate layer may be disposed between the single crystal substrate and the electrode layer, and the first intermediate layer may contain $ZrO_2$ and $Y_2O_3$.

The piezoelectric thin film element according to the aspect of the present invention may include an electrode layer, and the piezoelectric thin film that is staked on the electrode layer, a second intermediate layer may be disposed between the electrode layer and the piezoelectric thin film, and the second intermediate layer may contain at least one of $SrRuO_3$ and $LaNiO_3$.

The piezoelectric thin film element according to the aspect of the present invention may include an electrode layer, and the piezoelectric thin film that is stacked on the electrode layer, the electrode layer may contain a platinum crystal, a (002) plane of the platinum crystal may be oriented in a normal direction of a surface of the electrode layer, and a (200) plane of the platinum crystal may be oriented in an in-plane direction of the surface of the electrode layer.

According to still another aspect of the present invention, there is provided a piezoelectric transducer including the piezoelectric thin film element.

According to the aspects of the present invention, there are provided the piezoelectric thin film having a large piezoelectric performance index, the piezoelectric thin film element: including the piezoelectric thin film, and the piezoelectric transducer.

DETAILED DESCRIPTION

Figure 1A:
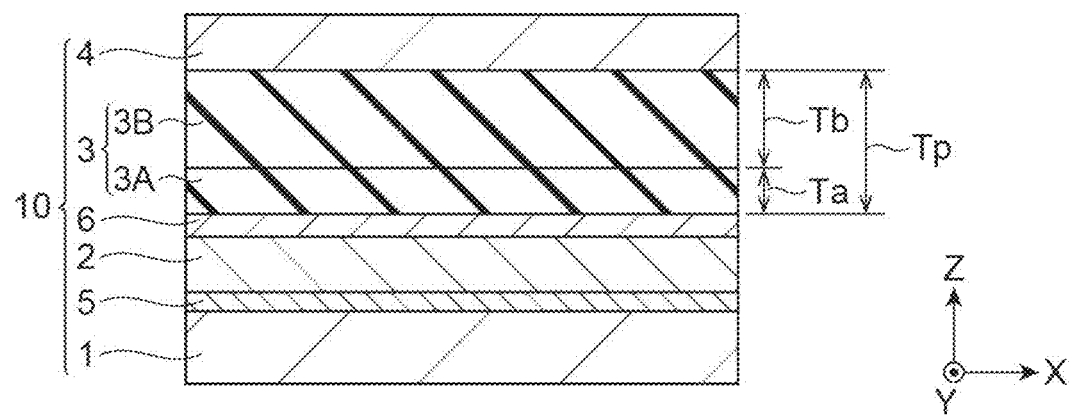
FIG. 1A is a schematic cross-sectional view of a piezoelectric thin film element according to an embodiment of the present invention.
Figure 1B:
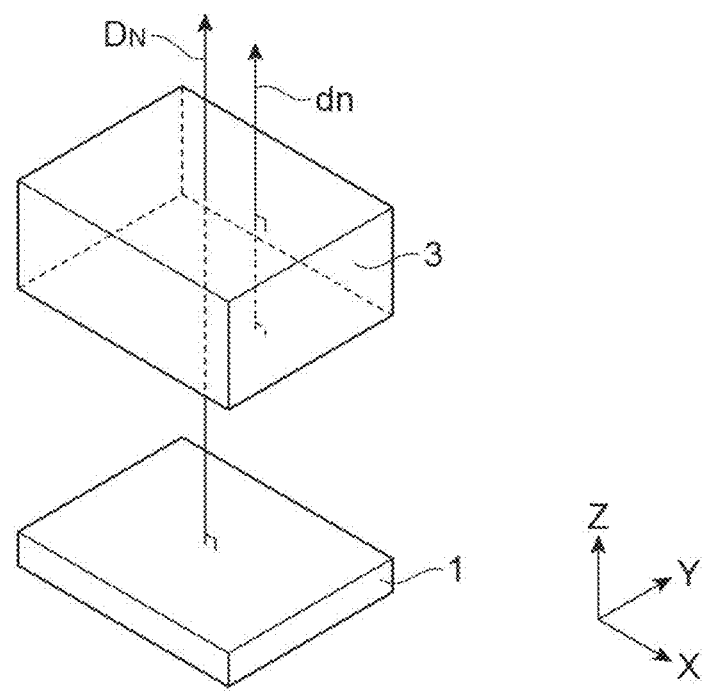
FIG. 1B is a perspective exploded view of the piezoelectric thin film element illustrated in FIG. 1A.
Figure 4:
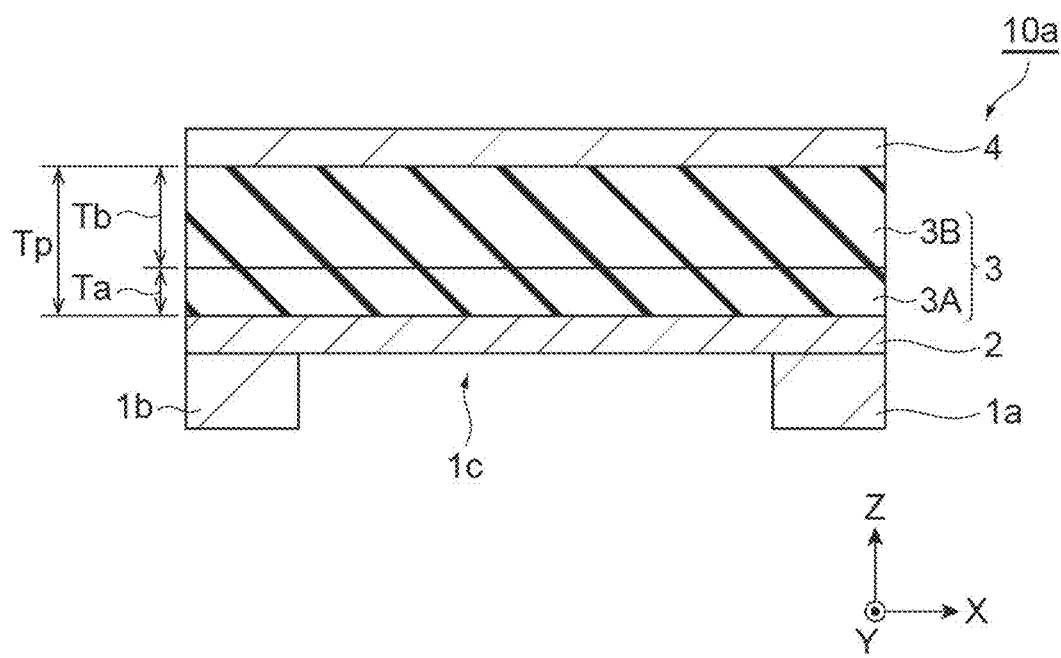
FIG. 4 is a schematic cross-sectional view of a piezoelectric thin film element (ultrasonic transducer) according to another embodiment of the present invention.

Hereinafter, a preferred embodiment of the present invention will be described with reference to the accompanying drawings. However, the present invention is not limited to the following embodiment. In the drawings, the same reference numeral will be given to the same or equivalent element. An X-axis, a Y-axis, and a Z-axis shown in FIG. 1A, FIG. 1B, and FIG. 4 are three coordinate axes orthogonal to each other. A direction of each of the three coordinate axes is common to FIG. 1A, FIG. 1B, and FIG. 4.

A piezoelectric thin film element according to this embodiment includes a piezoelectric thin film. The piezoelectric thin film element may be rephrased as a piezoelectric thin film device. FIG. 1A illustrates a cross-section of a piezoelectric thin film element 10 according to this embodiment. The cross-section of the piezoelectric thin film element 10 is orthogonal to a surface of a piezoelectric thin film 3. The piezoelectric thin film element 10 may include a single crystal substrate 1, a first electrode layer 2 (a lower electrode layer) that is stacked on the single crystal substrate 1, the piezoelectric thin film 3 that is stacked on the first electrode layer 2, and a second electrode layer 4 (an upper electrode layer) that is stacked on the piezoelectric thin film 3. The piezoelectric thin film element 10 may further include a first intermediate layer 5. The first intermediate layer 5 may be disposed between the single crystal substrate 1 and the first electrode layer 2, and the first electrode layer 2 may be directly stacked on a surface of the first intermediate layer 5. The piezoelectric thin film element 10 may further include a second intermediate layer 6. The second intermediate layer 6 may be disposed between the first electrode layer 2 and the piezoelectric thin film 3, and the piezoelectric thin film 3 may be directly stacked on a surface of the second intermediate layer 6. The thickness of each of the single crystal substrate 1, the first intermediate layer 5, the first electrode layer 2, the second intermediate layer 6, the piezoelectric thin film 3, and the second electrode layer 4 may be uniform. As illustrated in FIG. 1B, a normal direction dn of the surface of the piezoelectric thin film 3 may be approximately parallel to a normal direction $D_N$ of a surface of the single crystal substrate 1. The normal direction dn of the surface of the piezoelectric thin film 3 may be referred to a thickness direction of the piezoelectric thin film 3. In FIG. 1B, the first electrode layer, the first intermediate layer, the second intermediate layer, and the second electrode layer are omitted.

A modification example of the piezoelectric thin film element 10 does not have to include the single crystal substrate 1. For example, the single crystal substrate 1 may be removed after forming the first electrode layer 2 and the piezoelectric thin film 3. The modification example of the piezoelectric thin film element 10 does not have to include the second electrode layer 4. For example, after a piezoelectric thin film element that does not include the second electrode layer is supplied to a manufacturer of an electronic device as a product, the second electrode layer may be added to the piezoelectric thin film element in a process of manufacturing the electronic device. In a case where the single crystal substrate 1 functions as an electrode, the modification example of the piezoelectric thin film element 10 does not have to include the first electrode layer 2. That is, the modification example of the piezoelectric thin film element 10 may include the single crystal substrate 1, and the piezoelectric thin film 3 that is stacked on the single crystal substrate 1. In a case where the first electrode layer 2 is not provided, the piezoelectric thin film 3 may be directly stacked on the single crystal substrate 1. In a case where the first electrode layer 2 is not provided, the piezoelectric thin film 3 may be stacked on the single crystal substrate 1 through at least one intermediate layer of the first intermediate layer 5 and the second intermediate layer 6.

The piezoelectric thin film 3 contains a first piezoelectric layer 3A that is directly stacked on the first electrode layer 2, and a second piezoelectric layer 3B that is stacked on the first piezoelectric layer 3A. The piezoelectric thin film 3 may consist of the first piezoelectric layer 3A and the second piezoelectric layer 3B. The first piezoelectric layer 3A contains a tetragonal crystal 1 (first tetragonal crystal) of a perovskite-type oxide. The second piezoelectric layer 3B contains a tetragonal crystal 2 (second tetragonal crystal) of a perovskite-type oxide. It is needless to say that the perovskite-type, oxide is an oxide having a perovskite-type structure. The perovskite-type oxide is a main component of each of the first piezoelectric layer 3A and the second piezoelectric layer 3B. A total content rate of elements which constitute the perovskite-type oxide in the first piezoelectric layer 3A may be from 99 mol % to 100 mol %. A total content rate of elements which constitute the perovskite-type oxide in the second piezoelectric layer 3B may be from 99 mol % to 100 mol %. The first piezoelectric layer 3A may consist of the tetragonal crystal 1. The first piezoelectric layer 3A does not have to contain the tetragonal crystal 2. The first piezoelectric layer 3A may contain a minute amount of tetragonal crystal 2. The second piezoelectric layer 3B may consist of the tetragonal crystal 2. The second piezoelectric layer 3B does not have to contain the tetragonal crystal 1. The second piezoelectric layer 3B may contain a minute amount of tetragonal crystal 1. The first piezoelectric layer 3A may contain a minute amount of crystal other than the tetragonal crystal in addition to the tetragonal crystal 1. The second piezoelectric layer 3B also may contain a minute amount of crystal other than the tetragonal crystal in addition to the tetragonal crystal 2. For example, the minute amount of crystal other than the tetragonal crystal may be at least one kind of perovskite-type oxide crystal selected from the group consisting of a cubic crystal and a rhombohedral crystal. The tetragonal crystal 1 may be a single crystal or a polycrystal. The tetragonal crystal 2 may also be a single crystal or a polycrystal. A composition of the tetragonal crystal 1 may be different from a composition of the tetragonal crystal 2. A composition of the tetragonal crystal 1 may be the same as the composition of the tetragonal crystal 2.

The perovskite-type oxide may contain bismuth (Bi), iron (Fe), and oxygen (O). The perovskite-type oxide may contain both $Fe^{2+}$ (divalent iron) and $Fe^{3+}$ (trivalent iron) as iron. The perovskite-type oxide may contain only $Fe^{3+}$ (trivalent iron) as iron. The perovskite-type oxide may further contain an element $E^A$ in addition to Bi, Fe, and O, and the element $E^A$ is at least one kind of element selected from the group consisting of sodium (Na), potassium (K), and silver (Ag). The perovskite-type oxide may contain a plurality of kinds of element as $E^A$. The perovskite-type oxide may further contain an element $E^B$ in addition to Bi, Fe, and O, and the element $E^B$ may be at least one kind of element selected from the group consisting of magnesium (Mg), aluminum (Al), zirconium (Zr), titanium (Ti), nickel (Ni), and zinc (Zn). The perovskite-type oxide may contain a plurality of kinds of element as $E^B$. The perovskite-type oxide may contain all of Bi, Fe, $E^A$, $E^B$, and O. The piezoelectric thin film 3 may further contain other elements other than Bi, Fe, $E^A$, $E^B$, and O. The piezoelectric thin film 3 may not contain Pb. The piezoelectric thin film 3 may contain Pb.

Figure 2:
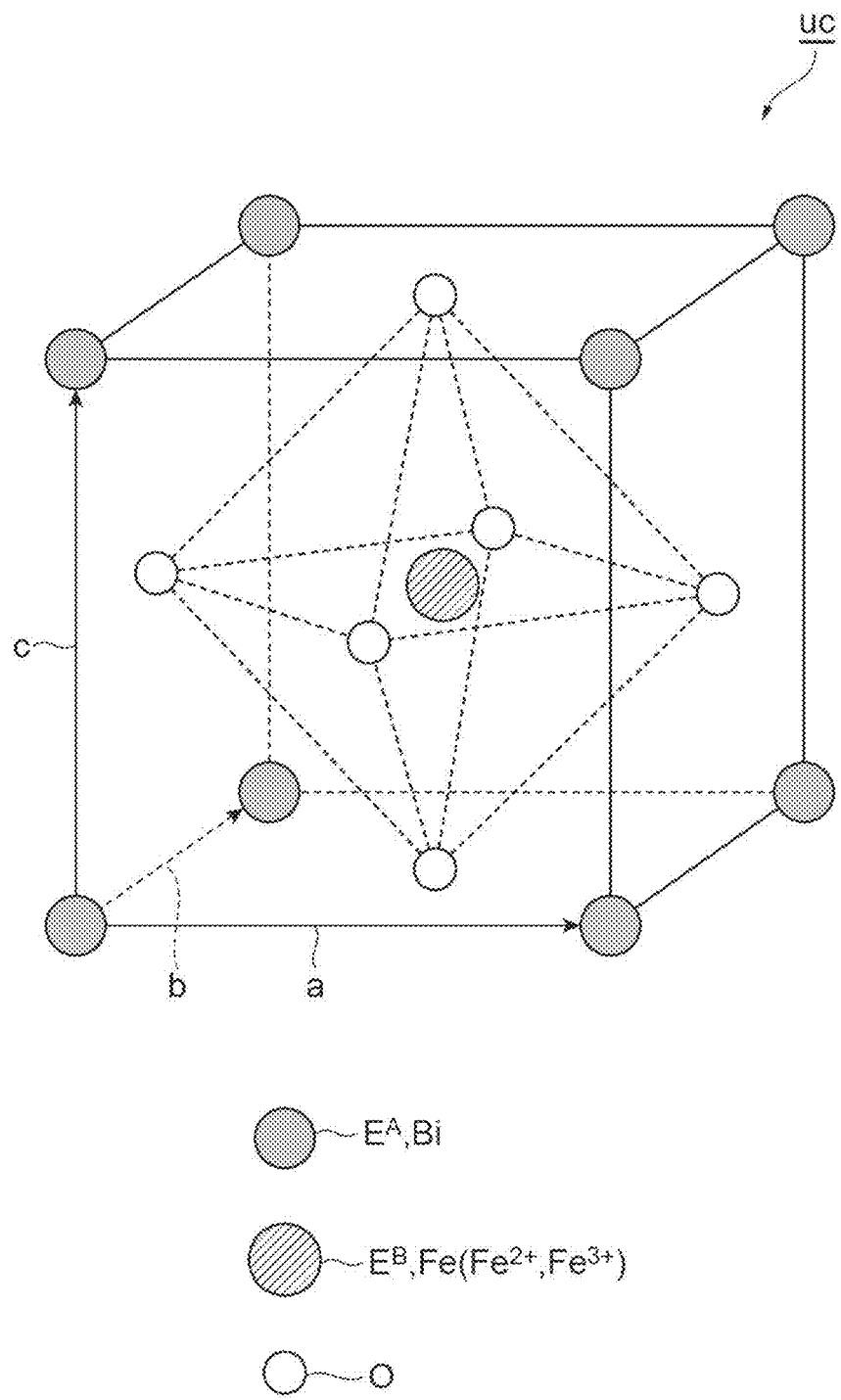
FIG. 2 is a perspective view of a unit cell of a perovskite-type structure (perovskite-type oxide), and illustrates arrangement of respective elements in the perovskite structure.

FIG. 2 illustrates a unit cell uc of the perovskite-type oxide. Each of a, b, and c in FIG. 2 is a basic vector of the perovskite structure. An element that is located at an A-site of the unit cell uc may be Bi or $E^A$. An element that is located at a B-site of the unit cell uc may be Fe or $E^B$. A part of Fe located at the B-site may be divalent iron ($Fe^{2+}$), and the remainder of Fe located at the B-site may be trivalent iron ($Fe^{2+}$). Fe that is located at the B-site may be only trivalent iron ($Fe^{3+}$).

Figure 3A:
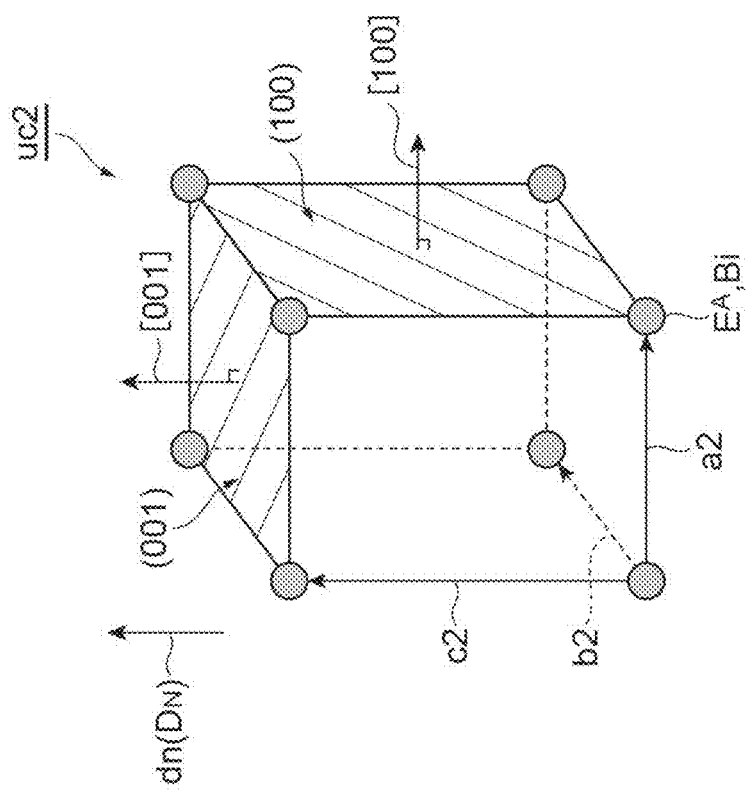
FIG. 3A is a schematic perspective view of a unit cell of a tetragonal crystal 1.
Figure 3B:
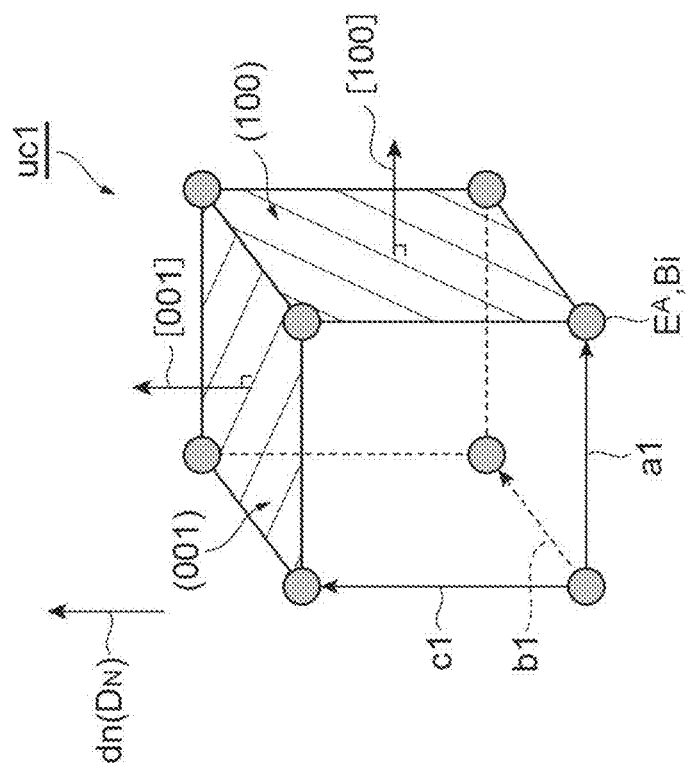
FIG. 3B is a perspective view of a unit cell of a tetragonal crystal 2.

FIG. 3A illustrates a unit cell uc1 of the tetragonal crystal 1. FIG. 3B illustrates a unit cell uc2 of the tetragonal crystal 2. $E^B$ and oxygen (O) in the unit cell uc1 and the unit cell uc2 are omitted for convenience of illustration, but the unit cell uc1 and the unit cell uc2 have the same perovskite structure as in the unit cell uc in FIG. 2.

Each of a1, b1, and c1 in FIG. 3A is a basic vector of the tetragonal crystal 1. The vector a1 in FIG. 3A corresponds to the vector a in FIG. 2. The vector b1 in FIG. 3A corresponds to the vector b in FIG. 2. The vector c1 in FIG. 3A corresponds to the vector c in FIG. 2. a1, b1, and c1 are orthogonal to each other. A direction of the vector a1 (a-axis) is [100]. A direction of the vector b1 (b-axis) is [010]. A direction of the vector c1 (c-axis) is [001]. A length a1 of the vector a1 is an interval of a (100) plane of the tetragonal crystal 1 (that is, a lattice constant in the [100] direction). A length b1 of the vector b1 is an interval of a (010) plane of the tetragonal crystal 1 (that is, a lattice constant in the [010] direction). A length c1 of the vector c1 is an interval of a (001) plane of the tetragonal crystal 1 (that is, a lattice constant in the [001] direction). The length a1 is equal to the length b1. The length c1 is more than the length a1.

Each of a2, b2, and c2 in FIG. 3B is a basic vector of the tetragonal crystal 2. The vector a2 in FIG. 3B corresponds to the vector a in FIG. 2. The vector b2 in FIG. 3B corresponds to the vector b in FIG. 2. The vector c2 in FIG. 3B corresponds to the vector c in FIG. 2. a2, b2, and c2 are orthogonal to each other. A direction of the vector a2 (a-axis) is [100]. A direction of the vector b2 (b-axis) is [010]. A direction of the vector c2 (c-axis) is [001]. A length a2 of the vector a2 is an interval of a (100) plane of the tetragonal crystal 2 (that is, a lattice constant in the [100] direction). A length b2 of the vector b2 is an interval of a (010) plane of the tetragonal crystal 2 (that is, a lattice constant in the [010] direction). A length c2 of the vector c2 is an interval of a (001) plane of the tetragonal crystal 2 (that is, a lattice constant in the [001] direction). The length a2 is equal to the length b2. The length c2 is more than the length a2.

As illustrated in FIG. 1B and FIG. 3A, the (001) plane of the tetragonal crystal 1 (uc1) is oriented in the normal direction do of the surface of the piezoelectric thin film 3. As illustrated in FIG. 1B and FIG. 3B, the (001) plane of the tetragonal crystal 2 (uc2) is also oriented in the normal direction din of the surface of the piezoelectric thin film 3. For example, each of the (001) plane of the tetragonal crystal 1 and the (001) plane of the tetragonal crystal 2 may be approximately parallel to the surface of the piezoelectric thin film 3, and the [001] direction of each of the tetragonal crystal 1 and the tetragonal crystal 2 may be approximately parallel to the normal direction dn of the surface of the piezoelectric thin film 3. The (001) plane of the tetragonal crystal 1 may be oriented in the normal direction $D_N$ of the surface of the single crystal substrate 1. The (001) plane of the tetragonal crystal 2 may also be oriented in the normal direction $D_N$ of the surface of the single crystal substrate 1. In other words, each of the (001) plane of the tetragonal crystal 1 and the (001) plane of the tetragonal crystal 2 may be approximately parallel to the surface of the single crystal substrate 1, and the [001] direction of each of the tetragonal crystal 1 and the tetragonal crystal 2 may be approximately parallel to the normal direction $D_N$ of the surface of the single crystal substrate 1.

A tetragonal crystal of the perovskite-type oxide is likely to be polarized in the [001] direction. That is, [001] is a direction in which the tetragonal crystal of the perovskite-type oxide is more likely to be polarized in comparison to another crystal orientation. Accordingly, when each of the (001) plane of the tetragonal crystal 1 and the (001) plane of the tetragonal crystal 2 is oriented in the normal direction dn of the surface of the piezoelectric thin film 3, the piezoelectric thin film 3 can have excellent piezoelectric properties.

From the same reason, the piezoelectric thin film 3 may be a ferroelectric material. Crystal orientation to be described below represents that each of the (001) plane of the tetragonal crystal 1 and the (001) plane of the tetragonal crystal 2 is oriented in the normal direction do of the surface of the piezoelectric thin film 3.

When the piezoelectric thin film 3 has the above-described crystal orientation, the piezoelectric thin film 3 can have large $(-e_{31,f})^2/\varepsilon_0\varepsilon_r$ (piezoelectric performance index). The above-described crystal orientation is a characteristic peculiar to a thin film. The thin film is a crystalline film that is formed by a vapor phase growth method or a solution method. On the other hand, it is difficult for a bulk of a piezoelectric material having the same composition as in the piezoelectric thin film 3 to have the above-described crystal orientation. The reason for this is because the bulk of the piezoelectric material is a sintered body (ceramic) of a powder containing essential elements of the piezoelectric material, and it is difficult to control a structure and orientation of a plurality of crystals which constitute the sintered body. Since the bulk of the piezoelectric material contains Fe, relative resistivity of the bulk of the piezoelectric material is lower that relative resistivity of the piezoelectric thin film 3. As a result, a leak current is likely to occur in the bulk of the piezoelectric material. Accordingly, it is difficult to polarize the bulk of the piezoelectric material through application of a high electric field, and thus it is difficult for the bulk of the piezoelectric material to have a large piezoelectric performance index.

c2/a2 of the tetragonal crystal 2 contained in the second piezoelectric layer 3B is more than c1/a1 of the tetragonal crystal 1 contained in the first piezoelectric layer 3A. That is, anisotropy of the tetragonal crystal 2 is higher than anisotropy of the tetragonal crystal 1.

Since c2/a2 is more than c1/a1, relative permittivity of the tetragonal crystal 2 is lower than relative permittivity of the tetragonal crystal 1. However, since c2/a2 is more than c1/a1, the crystal structure of the tetragonal crystal 2 is more rigid than the crystal structure of the tetragonal crystal 1, and thus it is more difficult for atoms in the tetragonal crystal 2 to move in comparison to atoms in the tetragonal crystal 1, polarization reversal of the tetragonal crystal 2 is less likely to occur in comparison to polarization reversal of the tetragonal crystal 1, and piezoelectric properties of the tetragonal crystal 2 are inferior to piezoelectric properties of the tetragonal crystal 1. In other words, since c1/a1 is smaller than c2/a2, the relative permittivity of the tetragonal crystal 1 is higher than relative permittivity of the tetragonal crystal 2, but the crystal structure of the tetragonal crystal 1 is softer than the crystal structure of the tetragonal crystal 2, and thus it is easier for atoms in the tetragonal crystal 1 to move in comparison to atoms in the tetragonal crystal 2. Accordingly, polarization reversal of the tetragonal crystal 1 is more likely to occur in comparison to polarization reversal of the tetragonal crystal 2, and thus the piezoelectric properties of the tetragonal crystal 1 are more excellent than piezoelectric properties of the tetragonal crystal 2.

In a case where an electric field is applied to the piezoelectric thin film 3, the polarization reversal of the tetragonal crystal 1 in the first piezoelectric layer 3A is likely to occur before the polarization reversal of the tetragonal crystal 2 in the second piezoelectric layer 3B. Due to the polarization reversal of the tetragonal crystal 1 which precedes the polarization reversal of the tetragonal crystal 2, the crystal structure of the tetragonal crystal 2 becomes unstable at an interface of the first piezoelectric layer 3A and the second piezoelectric layer 3B. In other words, due to the polarization reversal of the tetragonal crystal 1, polarization of the tetragonal crystal 2 is likely to fluctuate at the interface of the tetragonal crystal 1 and the tetragonal crystal 2. For example, due to the polarization reversal of the tetragonal crystal 1 in the first piezoelectric layer 3A, charges on a surface of the first piezoelectric layer 3A repel charges on a surface of the second piezoelectric layer 3B at the interface between the first piezoelectric layer 3A and the second piezoelectric layer 3B, and polarization of the tetragonal crystal 2 fluctuates.

According to the above-described mechanism, the polarization reversal of the tetragonal crystal 1 induces the polarization reversal of the tetragonal crystal 2. That is, when the first piezoelectric layer 3A is introduced between the first electrode layer 2 and the second piezoelectric layer 3B as a buffer layer that promotes the polarization reversal of the second piezoelectric layer 3B, polarization reversal is likely to occur at the entirety of the piezoelectric thin film 3. As a result, piezoelectric properties $(-e_{31,f})$ of the entirety of the piezoelectric thin film 3 become higher than piezoelectric properties of the tetragonal crystal 2 itself, and large $-e_{31,f}$ and low relative permittivity $(\varepsilon_r)$ are compatible with each other, and the piezoelectric thin film 3 can have large $(-e_{31,f})^2/\varepsilon_0\varepsilon_r$ (piezoelectric performance index).

However, the above-described mechanism is a hypothesis, and a technical scope of the present invention is not limited to the above-described mechanism.

In contrast to the piezoelectric thin film 3, deformation of a crystal structure due to a stress is less likely to occur in a bulk of a piezoelectric material. Accordingly, a large number of perovskite-type oxides which constitute the bulk of the piezoelectric material are cubic crystals, and it is difficult for the bulk of the piezoelectric material to have piezoelectric properties caused by the tetragonal crystal of the perovskite-type oxide.

c1/a1 is from 1.015 to 1.050. Since c1/a1 is from 1.015 to 1.050, the polarization reversal of the tetragonal crystal 1 is more likely to occur in comparison to the polarization reversal of the tetragonal crystal 2, the piezoelectric properties of the tetragonal crystal 1 are more excellent than the piezoelectric properties of the tetragonal crystal 2, and $-e_{31,f}$ and the piezoelectric performance index of the piezoelectric thin film 3 are large. In a case where c1/a1 is out of the above-described range, the relative permittivity of the tetragonal crystal 1 may be excessively high, or the piezoelectric properties of the tetragonal crystal 1 may deteriorate. As a result, the piezoelectric performance index of the piezoelectric thin film 3 decreases. For example, c1 may be from 4.010 Å to 4.084 Å. For example, a1 may be from 3.890 Å to 3.950 Å.

c2/a2 may be from 1.051 to 1.250, or from 1.051 to 1.249. In a case where c2/a2 is 1.051 or more, the relative permittivity of each of the second piezoelectric layer 3B containing the tetragonal crystal 2 and the piezoelectric thin film 3 is likely to decrease, and the piezoelectric performance index of the piezoelectric thin film 3 is likely to increase. In a case where c2/a2 is 1,250 or less, the polarization reversal of the tetragonal crystal 2 is likely to occur, and the piezoelectric performance index of the piezoelectric thin film 3 is likely to increase. For example, c2 may be from 4.155 Å to 4.710 Å. For example, a2 may be from 3.770 Å to 3.950 Å.

A magnitude relationship between c1 and c2, and a magnitude relationship between a1 and a2 may be specified by observing a cross-section of the piezoelectric thin film 3 which is parallel to a thickness direction of the piezoelectric thin film 3 at atomic level resolution by using a scanning transmission electron microscope (STEM).

In order to specify a specific value of each of c1 and c2 with high accuracy, a peak P1 of a diffracted X-ray deriving from the (001) plane of the tetragonal crystal 1, and a peak P2 of a diffracted X-ray deriving from the (001) plane of the tetragonal crystal 2 may be measured through out-of-plane measurement (2θ-θ method) on the surface of the piezoelectric thin film 3. One X-ray diffraction pattern that is measured includes both the peak P1 and the peak P2. In a case where a diffraction angle $2\theta_1$ of the peak P1 of the diffracted X-ray deriving from the (001) plane of the tetragonal crystal 1 is close to a diffraction angle $2\theta_2$ of the peak P2 of the diffracted X-ray deriving from the (001) plane of the tetragonal crystal 2, and a peak P3 in which the peak P1 and the peak P2 overlap each other is measured, the peak P1 may be approximated by a Gaussian function g1, the peak P2 may be approximated by another Gaussian function g2, and curve fitting of g1+g2 and the peak P3 may be performed. g1 after the curve fitting may be regarded as P1 and g2 after the curve fitting may be regarded as P2.

In order to specify specific a value of each of a1 and a2 with high accuracy, a peak P1' of a diffracted X-ray deriving from the (100) plane of the tetragonal crystal 1, and a peak P2' of a diffracted X-ray deriving from the (100) plane of the tetragonal crystal 2 may be measured through in-plane measurement (2θ-θ method) on the surface of the piezoelectric thin film 3. One X-ray diffraction pattern that is measured includes both the peak P1' and the peak P2'. In a case where a diffraction angle $2\theta_1'$ of the peak P1' of the diffracted X-ray deriving from the (100) plane of the tetragonal crystal 1 is close to a diffraction angle $2\theta_2'$ of the peak P2' of the diffracted X-ray deriving from the (100) plane of the tetragonal crystal 2, and a peak P3' in which the peak P1' and the peak P2' overlap each other is measured, the peak P1' may be approximated by a Gaussian function G1, the peak P2' may be approximated by another Gaussian function G2, and curve fitting of G1+G2 and the peak P3' may be performed. G1 after the curve fitting may be regarded as P1' and G2 after the curve fitting may be regarded as P2'.

$I_2/(I_1+I_2)$ may be 0.90 or more and less than 1.00, or from 0.91 to 0.99. $I_1$ is a peak intensity (maximum intensity) of a diffracted X-ray deriving from the (001) plane of the tetragonal crystal 1. $I_2$ is a peak intensity (maximum intensity) of a diffracted X-ray deriving from the (001) plane of the tetragonal crystal 2. Along with an increase in $I_2/(I_1+I_2)$, $-e_{31,f}$ tends to decrease, and the relative permittivity ($\varepsilon_r$) tends to decrease. In a case where $I_2/(I_1+I_2)$ of the piezoelectric thin film 3 is within the above-described range, large $(-e_{31,f})^2$ and low relative permittivity ($\varepsilon_r$) are likely to be compatible with each other, and the piezoelectric thin film 3 is likely to have large $(-e_{31,f})^2/\varepsilon_0\varepsilon_r$ (piezoelectric performance index). For example, a unit of each of $I_1+I_2$ may be cps (counts per second). $I_1$ and $I_2$ may be measured through out-of-plane measurement on the surface of the piezoelectric thin film 3. Measurement conditions of each of $I_1$ and $I_2$ may be set so that each of $I_1$ and $I_2$ is higher than the background intensity by at least three or more digits.

$I_1$ may be proportional to a total area of the (001) plane of the tetragonal crystal 1 that is oriented in the normal direction dn of the surface of the piezoelectric thin film 3, and $I_2$ may be proportional to a total area of the (001) plane of the tetragonal crystal 2 that is oriented in the normal direction do of the surface of the piezoelectric thin film 3. In other words, $I_1$ may be proportional to the amount of the tetragonal crystal 1 contained in the piezoelectric thin film 3, and $I_2$ may be proportional to the amount of the tetragonal crystal 2 contained in the piezoelectric thin film 3. Accordingly, $I_2/(I_1+I_2)$ may be an abundance ratio of the tetragonal crystal 2 to the total amount of the tetragonal crystal 1 and the tetragonal crystal 2. That is, the abundance ratio of the tetragonal crystal 2 to the total amount of the tetragonal crystal 1 and the tetragonal crystal 2 may be 90% or more and less than 100%.

The degree of orientation of each of the (001) plane of the tetragonal crystal 1 and the (001) plane of the tetragonal crystal 2 may be quantified by an orientation degree. The more the orientation degree of each of the (001) plane of the tetragonal crystal 1 and the (001) plane of the tetragonal crystal 2 is, the more the piezoelectric thin film 3 is likely to have a large piezoelectric performance index. The orientation degree of each crystal plane may be calculated on the basis of a peak of a diffracted X-ray deriving from each crystal plane. The peak of the diffracted X-ray deriving from each crystal plane may be measured by out-of-plane measurement on the surface of the piezoelectric thin film 3.

The orientation degree of the (001) plane of the tetragonal crystal 1 in the normal direction do of the surface of the piezoelectric thin film 3 may be expressed by $100 \times I_1/\Sigma I_{1(hkl)}$. $\Sigma I_{1(hkl)}$ is a total sum of peak intensities of diffracted X-rays deriving from respective crystal planes of the tetragonal crystal 1, the peak intensities being measured in an out-of-plane direction of the surface of the piezoelectric thin film 3. For example, $\Sigma I_{1(hkl)}$ may be $I_{1(001)}+I_{1(110)}+I_{1(111)}$. $I_{1(001)}$ is $I_1$ described above. That is, $I_{1(001)}$ is a peak intensity (maximum intensity) of a diffracted X-ray deriving from the (001) plane of the tetragonal crystal 1, the peak intensity being measured in the out-of-plane direction of the surface of the piezoelectric thin film 3. $I_{1(110)}$ is a peak intensity (maximum peak intensity) of a diffracted X-ray deriving from the (110) plane of the tetragonal crystal 1, the peak intensity being measured in the out-of-plane direction of the surface of the piezoelectric thin film 3. $I_{1(111)}$ is a peak intensity (maximum peak intensity) of a diffracted X-ray deriving from the (111) plane of the tetragonal crystal 1, the peak intensity being measured in the out-of-plane direction of the surface of the piezoelectric thin film 3.

The orientation degree of the (001) plane of the tetragonal crystal 2 may be expressed by $100 \times I_2/\Sigma I_{2(hkl)}$. $\Sigma I_{2(hkl)}$ is a total sum of peak intensities of diffracted X-rays deriving from respective crystal planes of the tetragonal crystal 2, the peak intensities being measured in the out-of-plane direction of the surface of the piezoelectric thin film 3. For example, $\Sigma I_{2(hkl)}$ may be $I_{2(001)}+I_{2(110)}+I_{2(111)}$. $I_{2(001)}$ is $I_2$ described above. That is, $I_{2(001)}$ is a peak intensity (maximum intensity) of a diffracted X-ray deriving from the (001) plane of the tetragonal crystal 2, the peak intensity being measured in the out-of-plane direction of the surface of the piezoelectric thin film 3. $I_{2(110)}$ is a peak intensity (maximum intensity) of a diffracted X-ray deriving from the (110) plane of the tetragonal crystal 2, the peak intensity being measured in the out-of-plane direction of the surface of the piezoelectric thin film 3. $I_{2(111)}$ is a peak intensity (maximum intensity) of a diffracted X-ray deriving from the (111) plane of the tetragonal crystal 2, the peak intensity being measured in the out-of-plane direction of the surface of the piezoelectric thin film 3.

The degree of orientation of each of the (001) plane of the tetragonal crystal 1 and the (001) plane of the tetragonal crystal 2 may be quantified by an orientation degree F. based on a Lotgering method. In any case where the orientation degree is calculated by one of the above-described methods, the orientation degree of each of the (001) plane of the tetragonal crystal 1 and the (001) plane of the tetragonal crystal 2 is from 70% to 100%, preferably from 80% to 100%, and more preferably from 90% to 100%. In other words, the (001) plane of the tetragonal crystal 1 may be oriented in the normal direction dn of the surface of the piezoelectric thin film 3 in preference to other crystal planes of the tetragonal crystal 1, and the (001) plane of the tetragonal crystal 2 may also be oriented in the normal direction dn o the surface of the piezoelectric thin film 3 in preference to other crystal planes of the tetragonal crystal 2.

One of or both the tetragonal crystal 1 and the tetragonal crystal 2 may contain $Fe^{2+}$. In a case where one of or both the tetragonal crystal 1 and the tetragonal crystal 2 contain $Fe^{2+}$, the piezoelectric thin film 3 is likely to have a large piezoelectric performance index. However, the reason why the piezoelectric thin film 3 is likely to have a large piezoelectric performance index due to $Fe^{2+}$ is not limited to the following reason.

In a case where a piezoelectric thin film of a $BiFeO_3$—(Bi,K)$TiO_3$ system has a composition near a morphotropic phase boundary (MPB) between a tetragonal crystal and a rhombohedral crystal, piezoelectric properties ($-e_{31,f}$) deriving from the tetragonal crystal are improved, but permittivity ($\varepsilon_0 \varepsilon_r$) also increases, and thus the piezoelectric performance index is less likely to be improved. In order to suppress an increase in permittivity, it is preferable to improve piezoelectric properties (ferroelectricity) of the piezoelectric thin film by composing the piezoelectric thin film by only a tetragonal crystal. Tetragonality of the piezoelectric thin film is realized by an epitaxial stress (a compressive stress due to lattice mismatching). The reason for this is because the piezoelectric thin film is compressed in a direction (that is, an a-axis direction and a h-axis direction) parallel to a surface of the piezoelectric thin film due to an epitaxial stress parallel to the surface of the piezoelectric thin film, and thus the piezoelectric thin film is distorted. However, the thicker the piezoelectric thin film is, the more the tetragonality of the piezoelectric thin film is difficult to be improved by only the epitaxial stress. The reason for this is because the thicker the piezoelectric thin film is, the more the entirety of the piezoelectric thin film is difficult to be distorted by the epitaxial stress. Accordingly, even in a case where the piezoelectric thin film is thick to a certain extent in which the epitaxial stress occurring in the piezoelectric thin film becomes weak, it is preferable to stabilize the tetragonal crystal structure of the piezoelectric thin film. Here, in one of or both the tetragonal crystal 1 and the tetragonal crystal 2, a B-site ion may be substituted with $Fe^{2+}$ so that an electron arrangement of an element (ion) located at a B-site of the perovskite-type oxide becomes similar to a d6 electron arrangement of $Co^{3+}$ that constitutes $BiCoO_3$. As a result, even in a case where the piezoelectric thin film 3 is thick to a certain extent in which the epitaxial stress occurring in the piezoelectric thin film 3 becomes weak, the tetragonality of the piezoelectric thin film 3 is improved. In other words, even in a case where the piezoelectric thin film 3 is thick to a certain extent in which the epitaxial stress occurring in the piezoelectric thin film 3 becomes weak, the first piezoelectric layer 3A is likely to contain the tetragonal crystal 1 and the second piezoelectric layer 3B is likely to contain the tetragonal crystal 2.

Even in a case of a composition system near the MPB in which the rhombohedral crystal is expected to be formed in the bulk of the piezoelectric material, rotation (rotation around the c-axis) of a $BO_6$ octahedron (or $BO_5$ pyramid) in the tetragonal crystal in which a part of the B-sites is substituted with $Fe^{2+}$ may occur, but polarization rotation due to formation of a pseudo cubic crystal is suppressed. In other words, in a perovskite oxide in which a part of the B-sites is substituted with $Fe^{2+}$, MPB is less likely to exist, and polarization rotation in which a direction of the c-axis of the tetragonal crystal varies is less likely to occur.

In a case where one of or both the tetragonal crystal 1 and the tetragonal crystal 2 contain $Fe^{2+}$ in accordance with the above-described mechanism, an improvement of the piezoelectric properties ($-e_{31,f}$) and a decrease in the permittivity ($\varepsilon_0 \varepsilon_r$) are likely to be compatible with each other, and the piezoelectric performance index is likely to increase.

However, the above-described mechanism relating to $Fe^{2+}$ is hypothesis, and the technical scope of the present invention is not limited to the above-described mechanism relating to $Fe^{2+}$.

In contrast to the piezoelectric thin film 3, in the bulk of the piezoelectric material, a crystal structure deformation due to a stress is less likely to occur. Accordingly, the majority of perovskite-type oxides which constitute the bulk of the piezoelectric material are cubic, and the bulk of the piezoelectric material is less likely to have the piezoelectric properties due to the tetragonal crystal of the perovskite-type oxide.

The thickness Tp of the piezoelectric thin film 3 may be equal to the sum of the thickness Ta of the first piezoelectric layer 3A and the thickness Tb of the second piezoelectric layer 3B. The thickness Tb of the second piezoelectric layer 3B may be more than the thickness Ta of the first piezoelectric layer 3A. The thickness Tp of the piezoelectric thin film 3 may be from 500 nm to 5000 nm. The thickness Ta of the first piezoelectric layer 3A may be from 10 nm to 300 nm, or from 80 nm to 300 nm. The thickness Tb of the second piezoelectric layer 3B may be from 490 nm to 4700 nm, or from 420 nm to 4700 nm. In a case where the thickness Ta of the first piezoelectric layer 3A is 10 nm or more, polarization reversal of the tetragonal crystal 1 in the first piezoelectric layer 3A is likely to induce polarization reversal of the tetragonal crystal 2 in the second piezoelectric layer 3B. As a result, the piezoelectric thin film 3 is likely to have a large piezoelectric performance index. In a case where the thickness Ta of the first piezoelectric layer 3A is 300 nm or less, the relative permittivity of the piezoelectric thin film 3 is likely to decrease, and the piezoelectric performance index of the piezoelectric thin film 3 is likely to increase. Even in a case where the thickness Tp of the piezoelectric thin film 3 is 500 nm or more and the piezoelectric thin film 3 is thick, an ion located at the B-site of the perovskite-type oxide is substituted with $Fe^{2+}$, and thus the piezoelectric thin film 3 is likely to have a large piezoelectric performance index. When the thickness Tp of the piezoelectric thin film 3 is adjusted to 5000 nm or less, the tetragonal crystal 1 and the tetragonal crystal 2 are likely to be formed regardless of the epitaxial stress, and the piezoelectric thin film 3 is likely to have a large piezoelectric performance index. Ta, Tb, and Tp are not limited to the above-described ranges. A measurement method of Ta, Tb, and Tp is not limited. For example, the thickness Tp of the piezoelectric thin film 3 may be measured by a scanning electron microscope (SEM) on a cross-section of the piezoelectric thin film 3 which is parallel to the normal direction dn of the piezoelectric thin film 3. The first piezoelectric layer 3A and the second piezoelectric layer 3B may be identified on the cross-section of the piezoelectric thin film 3 on the basis of a difference in a composition, or a magnitude relationship of c1/a1 and c2/a2. The thickness Ta of the first piezoelectric layer 3A and the thickness Tb of the second piezoelectric layer 3B may be measured by SEM on the cross-section of the piezoelectric thin film 3. Each of the thickness Tp of the piezoelectric thin film 3, the thickness Ta of the first piezoelectric layer 3A, and the thickness Tb of the second piezoelectric layer 3B may be approximately uniform.

The tetragonal crystal 1 may be expressed by the following Chemical Formula 1. The following Chemical Formula 1 is substantially the same as the following Chemical Formula 1a.

$$x1(Bi_{1-\alpha}E^A_\alpha)E^BO_3\text{—}y1BiFeO_3\text{-}z1Bi(Fe_{0.5}Ti_{0.5})O_3 \quad (3)$$

$$(Bi_{x1(1-\alpha)+y1+z1}E^A_{x1\alpha})(E^B_{x1}Fe_{y1+0.5z1}Ti_{0.5z1})O_{\pm\delta} \quad (1a)$$

x1+y1+z1 In Chemical Formula 1 may be 1.00. $E^A$ in Chemical Formula 1 is the above-described element. $E^B$ in Chemical Formula 1 is the above-described element.

Bi that constitutes $(Bi_{1-\alpha}E^A_\alpha)E^BO_3$ in Chemical Formula 1 is trivalent Bi ($Bi^{3+}$) or pentavalent Bi ($Bi^{5+}$). The sum of valences (ion valences) of $E^A$ that constitutes $(Bi_{1-\alpha}E^A_\alpha)E^BO_3$ in Chemical Formula 1 is expressed as $V_A$. The sum of valences (ion valences) of $E^B$ that constitutes $(Bi_{1-\alpha}E^A_\alpha)E^BO_3$ is expressed as $V_B$. The sum of valences of Bi, $E^A$, and $E^B$ which constitute $(Bi_{1-\alpha}E^A_\alpha)E^BO_3$ in chemical Formula 1 is expressed as $3(1-\alpha)+V_A\alpha+V_B$ or $5(1-\alpha)+V_A\alpha+V_B$. $3(1-\alpha)+V_A\alpha+V_B$ or $5(1-\alpha)+V_A\alpha+V_B$ may be +6 that balances with the sum (−6) of the valences (ion valences) of O. $3(1-\alpha)+V_A\alpha$ or $5(1-\alpha)+V_A\alpha$ may be +3. $V_B$ may be +3. In a case where two kinds of elements corresponding to the element $E^B$ in Chemical Formula 1 are expressed as an element $E^{B1}$ and an element $E^{B2}$, Chemical Formula 1 is substantially the same as the following Chemical Formula 1'. β in the following Chemical Formula 1' may be from 0.00 to 1.00. The valence (ion valence) of $E^{B1}$ is expressed as $V_{B1}$. The valence (ion valence) of $E^{B2}$ is expressed as $V_{B2}$. The sum $V_B$ of valences (ion valences) of $E^B$ is expressed as $(1-\beta)V_{B1}+\beta V_{B2}$. $(1-\beta)V_{B1}+\beta V_{B2}$ may be +3.

$$x1(Bi_{1-\alpha}E^A_\alpha)(E^{B1}_{1-\beta}E^{B2}_\beta)O_3\text{—}y1BiFeO_3\text{-}z1Bi(Fe_{0.5}Ti_{0.5})O_3 \quad (1')$$

$Bi_{x1(1-+)+y1+z1}E^A_{x1\alpha}$ in Chemical Formula 1a corresponds to an element located at the A-site of the perovskite structure. $E^B_{x1}Fe_{y1+0.5z1}Ti_{0.5z1}$ in Chemical Formula 1a corresponds to an element located at the B-site of the perovskite structure.

The valence of Fe that constitutes $y1BiFeO_3$ in Chemical Formula 1 is three, but the valence of Fe that constitutes $z1Bi(Fe_{0.5}Ti_{0.5})O_3$ in Chemical Formula 1 is two. Accordingly, when adjusting the composition of the raw material of the first piezoelectric layer 3A so that molar ratios of Bi, $E^A$, $E^B$, Fe, and Ti in the entirety of the raw material of the first piezoelectric layer 3A match molar ratios of Bi, $E^A$, $E^B$, Fe, and Ti in Chemical Formula 1, the tetragonal crystal 1 can contain $Fe^{2+}$.

x1 in Chemical Formula 1 may be from 0.10 to 0.90, or from 0.15 to 0.85. In a case where x1 is from 0.10 to 0.90, the tetragonal crystal 1 is likely to have the above-described crystal orientation, and c1/a1 is likely to be within the above-described range.

y1 in Chemical Formula 1 may be from 0.05 to 0.85, or from 0.05 to 0.80. In a case where y1 is from 0.05 to 0.85, the tetragonal crystal 1 is likely to have the above-described crystal orientation, and c1/a1 is likely to be within the above-above described range.

z1 in Chemical Formula 1 may be from 0.05 to 0.85, or from 0.05 to 0.80. In a case where z1 is from 0.05 to 0.85, the tetragonal crystal 1 is likely to have the above-described crystal orientation, and c1/a1 is likely to be within the above-described range.

α in Chemical Formula 1 may be 0.00 or more and less than 1.00. α may be 0.50 from the viewpoint that the tetragonal crystal 1 is likely to have the above-described crystal orientation and that c1/a1 is likely to be within the above-described range. As described above, β in Chemical Formula 1' may be from 0.00 to 1.00, or may be 0.00 or more and less than 1.00. β may be 0.50 from the viewpoint that the tetragonal crystal 1 is likely to have the above-described crystal orientation and that c1/a1 is likely to be within the above-described range.

δ in Chemical Formula 1a may be 0 or more. δ may be a value other than 0 as long as the crystal structure (perovskite structure) of the tetragonal crystal 1 is retained. For example, δ may be more than 0 and or less. For example, δ may be calculated from valences of respective ions located at the A-site and the B-site in the tetragonal crystal 1. The valences of the respective ions may be measured by X-ray photoelectron spectroscopy (XPS).

A total number of moles of Bi and $E^A$ contained in the tetragonal crystal 1 may be expressed as $[A]_1$, a total number of moles of Fe, Ti, and $E^B$ contained in the tetragonal crystal 1 may be expressed as $[B]_1$, and $[A]_1/[B]_1$ may be 1.0. $[A]_1/[B]_1$ may be a value other than 1.0 as long as the crystal structure (perovskite structure) of the tetragonal crystal 1 is retained. That is, $[A]_1/[B]_1$ may be less than 1.0, and $[A]_1/[B]_1$ may be more than 1.0.

The tetragonal crystal 2 may be expressed by the following Chemical Formula 2. The following Chemical Formula 2 is substantially the same as the following Chemical Formula 2a.

$$x2(Bi_{1-\alpha}E^A_\alpha)E^BO_3\text{—}y2BiFeO_3\text{-}z2Bi(Fe_{0.5}Ti_{0.5})O_3 \quad (2)$$

$$(Bi_{x2(1-\alpha)+y2+z2}E^A_{x2\alpha})(E^B_{x2}Fe_{y2+0.5z2}Ti_{0.5z2})O_{\pm\delta} \quad (2a)$$

x2+y2+z2 in Chemical Formula 2 may be 1.00. $E^A$ in Chemical Formula 2 is the above-described element. $E^B$ in Chemical Formula 2 is the above-described element. $E^A$ in Chemical Formula 2 may be the same as or different from $E^A$ in Chemical Formula 1. $E^B$ in Chemical Formula 2 may be the same as or different from $E^B$ in Chemical Formula 1. The valence of each element in Chemical Formula 2 may be the same as the valence of each element in Chemical Formula 1. In a case where two kinds of element corresponding to the element $E^B$ in Chemical Formula 2 are expressed as an element $E^{B1}$ and an element $E^{B2}$, Chemical Formula 2 is substantially the same as the following Chemical Formula 2'. β in the following Chemical Formula 2' may be from 0.00 to 1.00.

$$x2(Bi_{1-\alpha}E^A_\alpha)(E^{B1}_{1-\beta}E^{B2}_\beta)O_3\text{—}y2BiFeO_3\text{-}z2Bi(Fe_{0.5}Ti_{0.5})O_3 \quad (2')$$

$Bi_{x2(1-\alpha)+y2+x2}E^A_{x2\alpha}$ in Chemical Formula 2a corresponds to an element located at the A-site of the perovskite structure. $E^B_{x2}Fe_{y2+0.5z2}Ti_{0.5z2}$ in Chemical Formula 2a corresponds to an element located at the B-site of the perovskite structure.

The valence of Fe that constitutes $y2BiFeO_3$ in Chemical Formula 2 is three, but the valence of Fe that constitutes $z2Bi(Fe_{0.5}Ti_{0.5})O_3$ in Chemical Formula 2 is two. Accordingly, when adjusting the composition of the raw material of the second piezoelectric layer 3B so that molar ratios of Bi, $E^A$, $E^B$, Fe, and Ti in the entirety of the raw material of the second piezoelectric layer 3B match molar ratios of Bi, $E^A$, $E^B$, Fe, and Ti in Chemical Formula 2, the tetragonal crystal 2 can contain $Fe^{2+}$.

x2 in Chemical Formula 2 may be from 0.10 to 0.85, or from 0.10 to 0.80. In a case where x2 is from 0.10 to 0.85, the tetragonal crystal 2 is likely to have the above-described crystal orientation, and c2/a2 is likely to be within the above-described range.

y2 in Chemical Formula 2 may be from 0.10 to 0.85. In a case where y2 is from 0.10 to 0.85, the tetragonal crystal 2 is likely to have the above-described crystal orientation, and c2/a2 is likely to be within the above-described range.

z2 in Chemical Formula 2 may be from 0.05 to 0.80. In a case where z2 is from 0.05 to 0.80, the tetragonal crystal 2 is likely to have the above-described crystal orientation, and c2/a2 is likely to be within the above-described range.

α in Chemical Formula 2 may be 0.00 or more and less than 1.00. α may be 0.50 from the viewpoint that the tetragonal crystal 2 is likely to have the above-described crystal orientation and that c2/a2 is likely to be within the above-described range. As described above, β in Chemical Formula 2" may be from 0.00 to 1.00, or may be 0.00 or more and less than 1.00. β may be 0.50 from the viewpoint that the tetragonal crystal 2 is likely to have the above-described crystal orientation and that c2/a2 is likely to be within the above-described range.

δ in Chemical Formula 2a may be 0 or more. δ may be a value other than 0 as long as the crystal structure (perovskite structure) of the tetragonal crystal 2 is retained. For example, δ may be more than 0 and 1.0 or less. For example, δ may be calculated from valences of respective ions located at the A-site and the B-site in the tetragonal crystal 2. The valences of the respective ions may be measured by XPS.

A total number of moles of Bi and $E^A$ contained in the tetragonal crystal 2 may be expressed as $[A]_2$, a total number of moles of Fe, Ti, and $E^B$ contained in the tetragonal crystal 2 may be expressed as $[B]_2$, and $[A]_2/[B]_2$ may be 1.0. $[A]_2/[B]_2$ may be a value other than 1.0 as long as the crystal structure (perovskite structure) of the tetragonal crystal 2 is retained. That is, $[A]_2/[B]_2$ may be less than 1.0, and $[A]_2/[B]_2$ may be more than 1.0.

The tetragonal crystal 1 may be expressed by the following Chemical Formula 1w. $E^A$ in the following Chemical Formula 1w is the above-described element. $E^B$ in the following Chemical Formula 1w is the above-described element. w1 in the following Chemical Formula 1w may be from 0.30 to 0.80. α in the following Chemical Formula 1w may be 0.00 or more and less than 1.00.

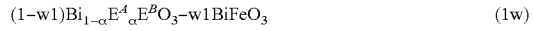

$$(1-w1)Bi_{1-\alpha}E^A{}_\alpha E^B O_3 - w1 BiFeO_3 \quad (1w)$$

The tetragonal crystal 2 may be expressed by the following Chemical Formula 2w. $E^A$ in the following Chemical Formula 2w is the above-described element. $E^B$ in the following Chemical Formula 2w is the above-described element. w2 in the following Chemical Formula 2w may be from 0.30 to 0.80. α in the following Chemical Formula 2w may be 0.00 or more and less than 1.00. $E^A$ in the following Chemical Formula 2w may be the same as or different from $E^A$ in Chemical Formula 1w, $E^B$ in the following Chemical Formula 2w may be the same as or different from $E^B$ in Chemical Formula 1w.

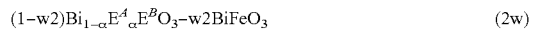

$$(1-w2)Bi_{1-\alpha}E^A{}_\alpha E^B O_3 - w2 BiFeO_3 \quad (2w)$$

The piezoelectric thin film 3 may be an epitaxial film. That is, the piezoelectric thin film 3 may be formed by epitaxial growth. The piezoelectric thin film 3 excellent in anisotropy and crystal orientation is likely to be formed by the epitaxial growth.

For example, an area of the surface of the piezoelectric thin film 3 may be from 1 μm² to 500 mm². An area of each of the single crystal substrate 1, the first intermediate layer 5, the first electrode layer 2, the second intermediate layer 6, and the second electrode layer 4 may be the same as the area of the piezoelectric thin film 3.

For example, the composition of the piezoelectric thin film 3 may be analyzed by X-ray fluorescent analysis (XRF), inductively coupled plasma (ICP) emission spectrometry, and X-ray photoelectron spectroscopy (XPS). With regard to a method of specifying the composition and the thickness of each of the first piezoelectric layer 3A and the second piezoelectric layer 3B, the composition of the piezoelectric thin film 3 may be analyzed by the XPS along a thickness direction of the piezoelectric thin film 3. For example, the composition of the surface of the piezoelectric thin film 3 may be continuously measured by the XPS while uniformly reducing the thickness Tp of the piezoelectric thin film 3 by ion milling or sputtering on the surface of the piezoelectric thin film 3. A composition of a cross-section of the piezoelectric thin film 3 may be analyzed along the thickness direction of the piezoelectric thin film 3. In the composition analysis of the cross-section the piezoelectric thin film 3 along the thickness direction of the piezoelectric thin film 3, an energy dispersive X-ray spectrometry (EDS) device mounted to a scanning electron microscope (SEM) or a scanning transmission electron microscope (STEM). A crystal structure and a crystal orientation of each of the first piezoelectric layer 3A and the second piezoelectric layer 3B may be specified by an X-ray diffraction (XRD) method. The above-described crystal structure and the crystal orientation of each of the first piezoelectric layer 3A and the second piezoelectric layer 3B may be a crystal structure and a crystal orientation at ordinary temperature.

A formation step of the piezoelectric thin film 3 includes a first film formation step and a second film formation step subsequent to the first film formation step. In the first film formation step, the first piezoelectric layer 3A is formed by a pulsed-laser deposition (PLD) method using a first target. In the second film formation step, the second piezoelectric layer 3B is directly formed on a surface of the first piezoelectric layer 3A by a PLD method using a second target.

The first target is a raw material of the first piezoelectric layer 3A. The first target: may be composed of all elements common to the first piezoelectric layer 3A (tetragonal crystal 1). A composition of the first target may be adjusted so that a molar ratio of each element that constitutes the first target matches a molar ratio of each element that constitutes the first piezoelectric layer 3A (tetragonal crystal 1). For example, the molar ratio of each element: that constitutes the first target may match a molar ratio of each element in Chemical Formula 1.

The second target is a raw material of the second piezoelectric layer 3B. The second target may be composed of all elements common to the second piezoelectric layer 3B (tetragonal crystal 2). A composition of the second target may be adjusted so that a molar ratio of each element that constitutes the second target matches a molar ratio of each element that constitutes the second piezoelectric layer 3B (tetragonal crystal 2). For example, the molar ratio of each element that constitutes the second target may match a molar ratio of each element in Chemical Formula 2.

In the PLD method, a target is irradiated with pulsed-laser light (for example, an excimer laser), and elements constituting the target are converted into plasma and are evaporated. According to the PLD method, respective elements constituting the target are uniformly converted into plasma in an instant. As a result, a molar ratio of each element in each piezoelectric layer is likely to approximately match a molar ratio of each element in each target, and segregation of elements in each piezoelectric layer is likely to be suppressed. In addition, according to the PLD method, the piezoelectric layer is likely to epitaxially grow, and the piezoelectric layer that is dense in an atomic level is likely to be formed. In the PLD method, a growth rate of each piezoelectric layer, anisotropy and crystal orientation of a tetragonal crystal that constitutes each piezoelectric layer can be controlled by changing the number of pulses (repetition frequency) of the pulsed-laser light. In accordance with a reduction in the repetition frequency of the pulsed-laser light, the growth rate of each piezoelectric layer decreases, and the anisotropy and the crystal orientation of the tetragonal crystal that constitutes each piezoelectric layer increase.

A repetition frequency f2 of pulsed-laser light in the second film formation step is less than a repetition frequency f1 of the pulsed-laser light in the first film formation step. Since f2 is smaller than f1, it is possible to form the piezoelectric thin film 3 in which c2/a2 of the tetragonal crystal 2 is more than c1/a1 of the tetragonal crystal 1. For example, the repetition frequency f1 of the pulsed-laser light in the first film formation step may be 20 Hz. When f1 is adjusted to 20 Hz, c1/a1 of the tetragonal crystal 1 in the first piezoelectric layer 3A is likely to be controlled to from 1.015 to 1.050. For example, the repetition frequency f2 of the pulsed-layer light in the second film formation step may be 10 Hz. When f2 is adjusted to 10 Hz, c2/a2 of the tetragonal crystal 2 in the second piezoelectric layer 3B is likely to be controlled to a value more than c1/a1.

The first target and the second target may be individually prepared by the following method.

As a raw material of each target, for example, an oxide of each of Bi, $E^A$, $E^B$, Fe, and Ti may be used. As the raw material, a substance that becomes an oxide through sintering, for example, carbonate or oxalate may be used instead of the oxide. After the raw materials are sufficiently dried at 100° C. or higher, the raw materials are weighed so that a molar ratio of each of Bi, $E^A$, $E^B$, Fe, and Ti matches a molar ratio of each element in each of each piezoelectric layer. In the first film formation step and the second film formation step, Bi in each target is more likely to be evaporate in comparison to other elements. Accordingly, the molar ratio of Bi in each target may be adjusted to a value more than the molar ratio of Bi in the piezoelectric layer. In a case where a raw material containing K as $E^A$ is used, K in the target is more likely to volatilize in comparison to other elements in the first film formation step and the second film formation step. Accordingly, the molar ratio of K in each target may be adjusted to a value more than the molar ratio of K in each piezoelectric layer.

The weighed raw materials are sufficiently mixed in an organic solvent or water. Mixing time may be from 5 hours to 20 hours. For example, a mean for mixing may be a ball mill. The mixed raw materials are sufficiently dried, and then the raw materials are molded by a pressing machine. The molded raw materials are calcined to obtain a calcined product. A calcination temperature may be from 750° C. to 900° C. Calcination time may be from 1 hour to 3 hours. The calcined product is pulverized in an organic solvent or water. Pulverization time may be 5 hours to 30 hours. A mean for pulverization may be a ball mill. After drying the pulverized calcined product, the calcined product to which a hinder solution is added is granulated to obtain a powder of the calcined product. The powder of the calcined product is press-molded to obtain a block-shaped molded body.

When the block-shaped molded body is heated, the binder in the molded body volatilizes. A heating temperature may be from 400° C. to 800° C. Heating time may be from 2 hours to 4 hours.

After volatilization of the binder, the molded body is sintered. A sintering temperature may be 800° C. to 1100° C. Sintering time may be from 2 hours to 4 hours. A temperature-raising rate and a temperature-lowering rate of the molded body in the sintering process may be, for example, from 50° C./hour to 300° C./hour.

Through the above-described process, the first target and the second target are individually prepared. An average grain size of crystal grains of oxides (perovskite-type oxides) contained in each target may be, for example, from 1 μm to 20 μm. Each target contains $Fe^{3+}$, but each target does not have to contain $Fe^{2+}$. In the first film formation step, when a part of $Fe^{3+}$ deriving from the first target is reduced, the first piezoelectric layer 3A containing $Fe^{2+}$ can be obtained. In the second film formation step, when a part of $Fe^{3+}$ deriving from the second target is reduced, the second piezoelectric layer 3B containing $Fe^{2+}$ can be obtained.

In the first film formation step, elements constituting the first target are evaporated in a vacuum atmosphere. Evaporated elements adhere to a surface of any of the second intermediate layer 6, the first electrode layer 2, and the single crystal substrate 1 and the evaporated elements are deposited thereon to form the first piezoelectric layer 3A.

In the second film formation step subsequent to the first film formation step, elements constituting the second target are evaporated in a vacuum atmosphere. Evaporated elements adhere to a surface of the first piezoelectric layer 3A and the evaporated elements are deposited thereon to form the second piezoelectric layer 3B.

In the first film formation step, the first piezoelectric layer 3A may be formed while heating the single crystal substrate 1 and the first electrode layer 2 in a vacuum chamber. A temperature (film formation temperature) of the single crystal substrate 1 and the first electrode layer 2 may be, for example, from 450° C. to 600° C. When the film formation temperature is 450° C. or higher, a part of $Fe^{3+}$ deriving from the first target is likely to be reduced, and the first piezoelectric layer 3A containing $Fe^{2+}$ is likely to be formed. In a case where the film formation temperature is lower than 450° C., $Fe^{3+}$ deriving from the target is less likely to be reduced, and the first piezoelectric layer 3A containing $Fe^{2+}$ is less likely to be obtained. The higher the film formation temperature is, the further cleanness of the surface of the single crystal substrate 1 or the first electrode layer 2 is improved, the higher crystallinity of the first piezoelectric layer 3A becomes, and the more the orientation degree of the crystal planes of the tetragonal crystal 1 is likely to increase. In a case where the film formation temperature is excessively high, respective elements constituting the first piezoelectric layer 3A are excessively reduced, and the first piezoelectric layer 3A having a desired composition is less likely to be obtained. In addition, in a case where the film formation temperature is excessively high, Bi or K is likely to be desorbed from the first piezoelectric layer 3A, and the composition of the first piezoelectric layer 3A is less likely to be controlled.

An oxygen partial pressure in the vacuum chamber may be, for example, from 0.1 Pa to 3.0 Pa, preferably from 0.1 Pa to 1.0 Pa, and more preferably from 0.1 Pa to 0.5 Pa. When the oxygen partial pressure is retained in the above-described range, a part of $Fe^{3+}$ deriving from the target is likely to be reduced, and the first piezoelectric layer 3A containing $Fe^{2+}$ is likely to be formed. In a case where the oxygen partial pressure is too low, respective elements deriving from the target are less likely to be sufficiently oxidized, the perovskite-type oxide is less likely to be formed, and the orientation degree of the crystal plane of the tetragonal crystal 1 is likely to decrease. In a case where the oxygen partial pressure is excessively high, $Fe^{3+}$ deriving from the target is less likely to be reduced, and the first piezoelectric layer 3A containing $Fe^{2+}$ is less likely to be Obtained. In addition, in a case where the oxygen partial pressure is excessively high, a growth rate of the first piezoelectric layer 3A is likely to decrease, and the orientation degree of the crystal planes of the tetragonal crystal 1 is likely to decrease.

In the first film formation step, in addition to the repetition frequency f1 of the pulsed-laser light, parameters such as the number of times of irradiation of the first target with the pulsed-laser light (film formation time) and a distance between the single crystal substrate 1 and the first target may be controlled. In accordance with an increase in the number of times of irradiation of the first target with the pulsed-laser light (film formation time), the thickness of the first piezoelectric layer 3A tends to increase. In accordance with a decrease in the distance between the single crystal substrate 1 and the first target, the thickness and the growth rate of the first piezoelectric layer 3A tend to increase.

The second film formation step may be performed by approximately the same method as in the above-described first film formation step except for the composition of the target and the repetition frequency of the pulsed laser light.

After the piezoelectric thin film 3 is formed by the first film formation step and the second film formation step, an annealing treatment (heating treatment) on the piezoelectric thin film 3 may be performed. A temperature (annealing temperature) of the piezoelectric thin film 3 in the annealing treatment may be, for example, from 300° C. to 1000° C., from 600° C. to 1000° C., or from 850° C. to 1000° C. Through the annealing treatment on the piezoelectric thin film 3, the piezoelectric properties of the piezoelectric thin film 3 tend to be further improved. Particularly, through the annealing treatment at from 850° C. to 1000° C., the piezoelectric properties of the piezoelectric thin film 3 are likely to be improved. However, the annealing treatment is not essential. The annealing treatment may be performed in a reducing atmosphere such as a nitrogen gas ($N_2$). Due to the annealing treatment in the reducing atmosphere, oxidation of $Fe^{2+}$ (generation of $Fe^{3+}$) in the piezoelectric thin film 3 in accordance with the annealing treatment is suppressed, and $Fe^{2+}$ in the piezoelectric thin film 3 is likely to be retained.

In the above-described formation step of the piezoelectric thin film 3 and the subsequent temperature-lowering process, a compressive stress occurs in the piezoelectric thin film 3. Due to the compressive stress, the piezoelectric thin film 3 is compressed in a direction (the a-axis direction and the b-axis direction) approximately parallel to the surface of the piezoelectric thin film 3. As a result, the tetragonal crystal 1 and the tetragonal crystal 2 are likely to be formed. For example, the compressive stress is caused by lattice mismatching between the single crystal substrate 1 and the piezoelectric thin film 3 (first piezoelectric layer 3A), or a difference in a coefficient of thermal expansion between the single crystal substrate 1 and the piezoelectric thin film 3 (first piezoelectric layer 3A).

For example, the single crystal substrate 1 may be a substrate composed of a single crystal of Si, or a substrate composed of a single crystal of a compound semiconductor such as GaAs. The single crystal substrate 1 may be a substrate consisting of single crystals of an oxide. The single crystal of the oxide may be, for example, MgO or a perovskite-type oxide (for example, $SrTiO_3$). For example, the thickness of the single crystal substrate 1 may be from 10 μm to 1000 μm. In a case where the single crystal substrate 1 has conductivity, the single crystal substrate 1 functions as an electrode, and thus the first electrode layer 2 may be omitted. For example, the single crystal substrate 1 having conductivity may be a single crystal of $SrTiO_3$ doped with niobium (Nb).

The crystal orientation of the single crystal substrate 1 may be equal in the normal direction $D_N$ of the surface of the single crystal substrate 1. That is, the surface of the single crystal substrate 1 may be parallel to a crystal plane of the single crystal substrate 1. The single crystal substrate 1 may be a uniaxially oriented substrate. For example, the (100) plane of the single crystal substrate 1 of Si or the like may be parallel to the surface of the single crystal substrate 1. That is, a [100] direction of the single crystal substrate 1 of Si or the like may be parallel to the normal direction $D_N$ of the surface of the single crystal substrate 1.

In a case where the (100) plane of the single crystal substrate 1 of Si or the like is parallel to the surface of the single crystal substrate 1, the (001) plane of each of the tetragonal crystal 1 and the tetragonal crystal 2 is likely to be oriented in the normal direction dn of the surface of the piezoelectric thin film 3.

As described above, the first intermediate layer 5 may be disposed between the single crystal substrate 1 and the first electrode layer 2. For example, the first intermediate layer 5 may contain at least one kind selected from the group consisting of titanium (Ti), chromium (Cr), titanium oxide ($TiO_2$), silicon oxide ($SiO_2$), and zirconium oxide ($ZrO_2$). The first electrode layer 2 is likely to come into close contact with the single crystal substrate 1 through the first intermediate layer 5. The first intermediate layer 5 may be crystalline. A crystal plane of the first intermediate layer 5 may be oriented in the normal direction $D_N$ of the surface of the single crystal substrate 1. Both the crystal plane of the single crystal substrate 1 and the crystal plane of the first intermediate layer 5 may be oriented in the normal direction $D_N$ of the surface of the single crystal substrate 1. A formation method of the first intermediate layer 5 may be a sputtering method, a vacuum vapor deposition method, a printing method, a spin coat method, or a sol-gel method.

The first intermediate layer 5 may contain $ZrO_2$ and an oxide of rare-earth element. When the first intermediate layer 5 contains $ZrO_2$ and an oxide of rare-earth element, the first electrode layer 2 consisting of a platinum crystal is likely to be formed on the surface of the first intermediate layer 5, a (002) plane of the platinum crystal is likely to be oriented in a normal direction of a surface of the first electrode layer 2, and a (200) plane of the platinum crystal is likely to be oriented in an in-plane direction of the surface of the first electrode layer 2. The rare-earth element may be at least one kind selected from the group consisting of scandium (Sc), ytterbium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first intermediate layer 5 may contain $ZrO_2$ and $Y_2O_3$. For example, the first intermediate layer 5 may consist of yttrium oxide stabilized zirconia ($Y_2O_3$ added $ZrO_2$). The first intermediate layer 5 may contain a first layer consisting of $ZrO_2$ and a second layer consisting of $Y_2O_3$. The first layer consisting of $ZrO_2$ may be directly staked on the surface of the single crystal substrate 1. The second layer consisting of $Y_2O_3$ may be directly stacked on a surface of the first layer. The first electrode layer 2 may be directly stacked on a surface of the second layer consisting of $Y_2O_3$. In a case where the first intermediate layer 5 contains $ZrO_2$ and $Y_2O_3$, the first piezoelectric layer 3A and the second piezoelectric layer 3B are likely to epitaxially grow, and the (001) plane of each of the tetragonal crystal 1 and the tetragonal crystal 2 is likely to be preferentially oriented in the normal direction dn of the surface of the piezoelectric thin film 3. In addition, in a case where the first intermediate layer 5 contains $ZrO_2$ and $Y_2O_3$, the first electrode layer 2 consisting of a platinum crystal is likely to be formed on the surface of the first intermediate layer 5, a (002) plane of the platinum crystal is likely to be oriented in a normal direction of the surface of the first electrode layer 2, and a (200) plane of the platinum crystal is likely to be oriented in an in-plane direction of the surface of the first electrode layer 2.

For example, the first: electrode layer 2 may consist of at least one kind of metal selected from the group consisting of platinum (Pt), palladium (Pd), rhodium (Rh), gold (Au), ruthenium (Ru), iridium (Ir), molybdenum (Mo), titanium (Ti), tantalum (Ta), and nickel (Ni). For example, the first electrode layer 2 may consist of a conductive metal oxide such as strontium ruthenate ($SrRuO_3$), lanthanum nickelate ($LaNiO_3$), or lanthanum strontium cohaltate ($(La, Sr)CoO_3$). The first electrode layer 2 may be crystalline. A crystal plane of the first electrode layer 2 may be oriented in the normal direction $D_N$ of the single crystal substrate 1. The crystal plane of the first electrode layer 2 may be approximately parallel to the surface of the single crystal substrate 1. Both the crystal plane of the single crystal substrate 1 and the crystal plane of the first electrode layer 2 may be oriented in the normal direction $D_N$ of the single crystal substrate 1. The crystal plane of the first electrode layer 2 which is oriented in the normal direction $D_N$ of the single crystal substrate 1 may be approximately parallel to the (001) plane of each of the tetragonal crystal 1 and the tetragonal crystal 2. For example, the thickness of the first electrode layer 2 may be from 1 nm to 1.0 μm. A formation method of the first electrode layer 2 may be a sputtering method, a vacuum vapor deposition method, a printing method, a spin coat method, or a sol-gel method. In a case of the printing method, the spin coat method, or the sol-gel method, a heating treatment (annealing) on the first electrode layer 2 may be performed to increase crystallinity of the first electrode layer 2.

The first electrode layer 2 may contain a platinum crystal. The first electrode layer 2 may consist of the platinum crystal. The platinum crystal is a cubic crystal having a face centered cubic (fcc) lattice structure. A (002) plane of the platinum crystal may be oriented in a normal direction of the surface of the first electrode layer 2, and a (200) plane of the platinum crystal may be oriented in an in-plane direction of the surface of the first electrode layer 2. In other words, the (002) plane of the platinum crystal may be approximately parallel to the surface of the first electrode layer 2, and the (200) plane of the platinum crystal may be approximately orthogonal to the surface of the first electrode layer 2. In a case where the (002) plane and the (200) plane of the platinum crystal constituting the first electrode layer 2 have the above-described orientations, the first piezoelectric layer 3A and the second piezoelectric layer 3B are likely to epitaxially grow on the surface of the first: electrode layer 2, and the (001) plane of each of the tetragonal crystal 1 and the tetragonal crystal 2 is likely to be preferentially oriented in the normal direction do of the surface of the piezoelectric thin film 3. The surface of the first electrode layer 2 may be approximately parallel to the surface of the piezoelectric thin film 3. That is, a normal direction of the surface of the first electrode layer 2 may be approximately parallel to the normal direction do of the surface of the piezoelectric thin film 3.

As described above, the second intermediate layer 6 may be disposed between the first electrode layer 2 and the piezoelectric thin film 3. For example, the second intermediate layer 6 may contain at least one kind selected from the group consisting of $SrRuO_3$, $LaNiO_3$, and $(La,Sr)CoO_3$. For example, $(La,Sr)CoO_3$ may be $La_{0.5}Sr_{0.5}CoO_3$. The second intermediate layer 6 may be crystalline. For example, the second intermediate layer 6 may be a staked body constituted by at least two kinds of buffer layers selected from the group consisting of a layer containing a crystal of $SrRuO_3$, a layer containing a crystal of $LaNiO_3$, and a layer containing a crystal of $(La,Sr)CoO_3$. Any of $SrRuO_3$, $LaNiO_3$, and $(La,Sr)CoO_3$ has a perovskite structure. Accordingly, in a case where the second intermediate layer 6 contains at least one kind selected from the group consisting of $SrRuO_3$, $LaNiO_3$, and $(La,Sr)CoO_3$, the first piezoelectric layer 3A and the second piezoelectric layer 3B are likely to epitaxially grow, and the (001) plane of each of the tetragonal crystal 1 and the tetragonal crystal 2 is likely to be preferentially oriented in the normal direction do of the surface of the piezoelectric thin film 3. In addition, the piezoelectric thin film 3 (first piezoelectric layer 3A) is likely to come into close contact with the first electrode layer 2 through the second intermediate layer 6. A crystal plane of the second intermediate layer 6 may be oriented in the normal direction $D_N$ of the surface of the single crystal substrate 1. Both the crystal plane of the single crystal substrate 1 and the crystal plane of the second intermediate layer 6 may be oriented in the normal direction $D_N$ of the surface of the single crystal substrate 1. A formation method of the second intermediate layer 6 may be a sputtering method, a vacuum vapor deposition method, a printing method, a spin coat method, or a sol-gel method.

For example, the second electrode layer 4 may consist of at least one kind of metal selected from the group consisting of Pt, Pd, Rh, Au, Ru, Ir, Mo, Ti, Ta, and Ni. For example, the second electrode layer 4 may consist of at least one kind of conductive metal oxide selected from the group consisting of $LaNiO_3$, $SrRuO_3$, and $(La,Sr)CoO_3$. The second electrode layer 4 may be crystalline. A crystal plane of the second electrode layer 4 may be oriented in the normal direction $D_N$ of the single crystal substrate 1. The crystal plane of the second electrode layer 4 may be approximately parallel to the surface of the single crystal substrate 1. The crystal plane of the second electrode layer 4 which is oriented in the normal direction $D_N$ of the single crystal substrate may be approximately parallel to the (001) plane of each of the tetragonal crystal 1 and the tetragonal crystal 2. For example, the thickness of the second electrode layer 4 may be from 1 nm to 1.0 μm. A formation method of the second electrode layer 4 may be a sputtering method, a vacuum vapor deposition method, a printing method, a spin coat method, or a sol-gel method. In a case of the printing method, the spin coat method, or the sol-gel method, a heating treatment (annealing) on the second electrode layer 4 may be performed to increase crystallinity of the second electrode layer 4.

A third intermediate layer may be disposed between the piezoelectric thin film 3 and the second electrode layer 4. The second electrode layer 4 is likely to come into close contact with the piezoelectric thin film 3 (second piezoelectric layer 3B) through the third intermediate layer. A composition, a crystal structure, and a formation method of the third intermediate layer may be the same as in the second intermediate layer.

At least a part or the entirety of a surface of the piezoelectric thin film element 10 may be covered with a protective film. Due to covering with the protective film, durability (moisture resistance) of the piezoelectric thin film element 10 is improved.

Applications of the piezoelectric thin film element according to this embodiment are various. For example, the piezoelectric thin film element may be used in a piezoelectric transducer. That is, the piezoelectric transducer according to this embodiment may include the above-described piezoelectric thin film element. For example, the piezoelectric transducer may be an ultrasonic transducer such as an ultrasonic sensor. For example, the piezoelectric thin film element may be a harvester (vibration power generation element). The piezoelectric thin film element according to this embodiment includes the piezoelectric thin film having large ($-e_{31,f}^2/\varepsilon_0\varepsilon_r$), and thus the piezoelectric thin film element is suitable for the ultrasonic transducer or the harvester. The piezoelectric thin film element may be a piezoelectric actuator. The piezoelectric actuator may be used in a head assembly, a head stack assembly, or a hard disk drive. The piezoelectric actuator may be used in a printer head, or an inkjet printer device. The piezoelectric actuator may be a piezoelectric switch. The piezoelectric actuator may be used in haptics. That is, the piezoelectric actuator may be used in various devices for which feedback by skin sensation (a sense of touch) is required. The device for which feedback by the skin sensation is required is, for example, a wearable device, a touch pad, a display, or a game controller. The piezoelectric thin film element may be a piezoelectric sensor. For example, the piezoelectric sensor may be a piezoelectric microphone, a gyro sensor, a pressure sensor, a pulse sensor, or a shock sensor. The piezoelectric thin film element may be a filter (a SAW filter or a BAW filter), an oscillator, or an acoustic multi-layer film. The piezoelectric thin film element may be a part of the entirety of a micro electro mechanical system (MEMS). For example, the piezoelectric thin film element may be a piezoelectric micromachined ultrasonic transducer (PMUT). For example, a product using the piezoelectric micromachined ultrasonic transducer may be a living body authentication sensor or medical/health care sensor (a fingerprint sensor, an ultrasonic type blood vessel authentication sensor, or the like), or a time of flight (ToF) sensor.

FIG. 4 illustrates a schematic cross-section of an ultrasonic transducer 10a including the piezoelectric thin film 3. The cross-section of the ultrasonic transducer 10a is orthogonal to the surface of the piezoelectric thin film 3. The ultrasonic transducer 10a may include substrates 1a and 1b, a first electrode layer 2 provided on the substrates 1a and 1b, a piezoelectric thin film 3 stacked on the first electrode layer 2, and a second electrode layer 4 stacked on the piezoelectric thin film 3. The piezoelectric thin film 3 includes a first piezoelectric layer 3A stacked on the first electrode layer 2, and a second piezoelectric layer 3B stacked on the first piezoelectric layer 3A. an acoustic cavity 1c may be provided on a downward side of the piezoelectric thin film 3. An ultrasonic signal is transmitted or received by bending or vibration of the piezoelectric thin film 3. A first intermediate layer may be interposed between the substrates 1a and 1b, and the first electrode layer 2. A second intermediate layer may be interposed between the first electrode layer 2 and the piezoelectric thin film 3.

The present invention is not limited to the above-described embodiment. For example, the piezoelectric thin film 3 may include a second piezoelectric layer 3B stacked on the first electrode layer 2, and a first piezoelectric layer 3A that is directly stacked on the second piezoelectric layer 3B.

EXAMPLES

The present invention will be described in more detail with reference to the following examples and comparative examples. The present invention is not limited to the following examples.

Example 1

A single crystal substrate consisting of Si was used for preparing a piezoelectric thin film element of Example 1. A (100 plane of Si was parallel to a surface of the single crystal substrate. The single crystal substrate had a tetragonal shape having dimensions of 20 mm×20 mm. The thickness of the single crystal substrate was 500 μm.

In a vacuum chamber, a crystalline first intermediate layer consisting of $ZrO_2$ and $Y_2O_3$ was formed on the entirety of the surface of the single crystal substrate. The first intermediate layer was formed by a sputtering method. The thickness of the first intermediate layer was 30 nm.

In the vacuum chamber, a first electrode layer consisting of a crystal of Pt was formed on the entirety of a surface of the first intermediate layer. The first electrode layer was formed by a sputtering method. The thickness of the first electrode layer was 200 nm. A temperature of the single crystal substrate in a process of forming the first electrode layer was maintained at 500° C.

An XRD pattern of the first electrode layer was measured by out-of-plane measurement on the surface of the first electrode layer. An XRD pattern of the first electrode layer was measured by in-plane measurement on the surface of the first electrode layer. In the measurement of the XRD patterns, an X-ray diffraction apparatus (Smart Lab) manufactured by Rigaku Corporation was used. Measurement conditions were set so that each peak intensity in the XRD patterns becomes higher than the background intensity by at least three digits. A peak of a diffracted X-ray deriving from a (002) plane of the Pt crystal was detected by out-of-plane measurement. That is, the (002) plane of the Pt crystal was oriented in a normal direction of the surface of the first electrode layer. A peak of a diffracted X-ray deriving from a (200) plane of the Pt crystal was detected by in-plane measurement. That is, the (200) plane of the Pt crystal was oriented in an in-plane direction of the surface of the first electrode layer.

The above-described first film formation step (PLD method) was carried out in a vacuum chamber to form a first piezoelectric layer on the entirety of the surface of the first electrode layer. A repetition frequency f1 of pulsed-laser light in the first film formation step was adjusted to 20 Hz. The thickness Ta of the first piezoelectric layer was adjusted to a value shown in the following Table 2.

The composition of the first target used in the first film formation step is expressed by the following Chemical Formula 1A. In a case where the composition of the first target is expressed by Chemical Formula 1', $E^A$ in the following Chemical Formula 1' was K, $E^{B1}$ in the following Chemical Formula 1' was Ti, $E^{B2}$ in the following Chemical Formula 1' was absent, a in the following Chemical Formula 1' was 0.5, and β in the following Chemical Formula 1' was zero. In a case of Example 1, x1, y1, and z1 in the following Chemical Formula 1A were values shown in the following Table 1.

$$x1(Bi_{0.5}K_{0.5})TiO_3 - y1BiFeO_3 - z1Bi(Fe_{0.5}Ti_{0.5})O_3 \quad (1A)$$

$$x1(Bi_{1-\alpha}E^A{}_\alpha)(E^{B1}{}_{1-\beta}E^{B2}{}_\beta)O_3 - y1BiFeO_3 - z1Bi(Fe_{0.5}Ti_{0.5})O_3 \quad (1')$$

After the first film formation step, the above-described second film formation step (PLD method) was carried out in a vacuum chamber to form a second piezoelectric layer on the entirety of a surface of the first piezoelectric layer. The repetition frequency f2 of pulsed-laser light in the second film formation step was adjusted to 10 Hz. The thickness Tb of the second piezoelectric layer was adjusted to a value shown in the following Table 2.

The composition of the second target used in the second film formation step is expressed by the following Chemical Formula 2A. In a case where the composition of the second target is expressed by Chemical Formula 2', $E^A$ in the following Chemical Formula 2' was K, $E^{B1}$ in the following Chemical Formula 2' was Ti, $E^{B2}$ in the following Chemical Formula 2' was absent, α in the following Chemical Formula 2' was 0.5, and β in the following Chemical Formula 2' was zero. In a case of Example 1, x2, y2, and z2 in the following Chemical Formula 2A were values shown in the following Table 1.

$$x2(Bi_{0.5}K_{0.5})TiO_3 - y2BiFeO_3 - z2Bi(Fe_{0.5}Ti_{0.5})O_3 \quad (2A)$$

$$x2(Bi_{1-\alpha}E^A{}_\alpha)(E^{B1}{}_{1-\beta}E^{B2}{}_\beta)O_3 - y2BiFeO_3 - z2Bi(Fe_{0.5}Ti_{0.5})O_3 \quad (2')$$

Through the first film formation step and the second film formation step, a piezoelectric thin film including the first piezoelectric layer and the second piezoelectric layer was formed. The thickness Tp of the piezoelectric thin film was a value shown in the following Table 2. A temperature (film formation temperature) of the single crystal substrate in the first film formation step and the second film formation step was maintained at 500° C. An oxygen partial pressure inside the vacuum chamber in the first film formation step and the second film formation step was maintained at 1 Pa.

A composition of the surface of the piezoelectric thin film 3 was continuously analyzed by an XPS method along a thickness direction of the piezoelectric thin film 3 while uniformly reducing the thickness Tp of the piezoelectric thin film 3 by sputtering on the surface of the piezoelectric thin film 3. The result of the analysis showed that the composition of the first piezoelectric layer matched the composition of the first target, and that the composition of the second piezoelectric layer matched the composition of the second target.

An XRD pattern of the piezoelectric thin film was measured through out-of-plane measurement on the surface of the piezoelectric thin film by using the X-ray diffraction device. In addition, another XRD pattern of the piezoelectric thin film was measured through in-plane measurement on the surface of the piezoelectric thin film. Measurement conditions were set so that each peak intensity in the XRD patterns becomes higher than the background intensity by at least three digits. A measurement apparatus and measurement conditions of each of the XRD patterns were the same as described above. A cross-section of the piezoelectric thin film which is parallel to the thickness direction of the piezoelectric thin film was observed at atomic level resolution by using a scanning transmission electron microscope (STEM).

Results of the above-described analyses using the X-ray diffraction apparatus and the STEM showed that the piezoelectric thin film has the following characteristics.

The first piezoelectric layer consisted of the tetragonal crystal 1 of the perovskite-type oxide.

The (001) plane of the tetragonal crystal 1 was preferentially oriented in a normal direction of the surface of the piezoelectric thin film. That is, the orientation degree of the (001) plane of the tetragonal crystal 1 in the normal direction of the surface of the piezoelectric thin film was 90% or more. As described above, the orientation degree of the orientation degree of the (001) plane of the tetragonal crystal 1 is expressed as $100 \times I_{1(001)}/I_{1(001)} + I_{1(110)} + I_{1(111)}$).

c1/a1 of the tetragonal crystal 1 was a value shown in the following Table 2.

The second piezoelectric layer consisted of the tetragonal crystal 2 of the perovskite-type oxide.

The (001) plane of the tetragonal crystal was preferentially oriented in the normal direction of the surface of the piezoelectric thin film. That is, the orientation degree of the (001) plane of the tetragonal crystal 2 in the normal direction of the surface of the piezoelectric thin film was 90% or more. As described above, the orientation degree of the orientation degree of the (001) plane of the tetragonal crystal 2 is expressed as $100 \times I_{2(001)}/I_{2(001)} + I_{2(110)} + I_{2(111)}$.

c2/a2 of the tetragonal crystal 2 was a value shown in the following Table 2.

$I_2/(I_1+I_2)$ was a value shown in the following Table 2. Definition of $I_2/(I_1+I_2)$ is as described above.

A stacked body composed of the single crystal substrate, the first intermediate layer stacked on the single crystal substrate, the first electrode layer stacked on the first intermediate layer, and the piezoelectric thin film stacked on the first electrode layer was prepared by the above-described method. The following processes were performed by using the stacked body.

A second electrode layer consisting of Pt was formed on the entirety of the surface of the piezoelectric thin film in a vacuum chamber.

The second electrode layer was formed by a sputtering method. A temperature of the single crystal substrate in the process of forming the second electrode layer was maintained at 500° C. The thickness of the second electrode layer was 200 nm.

A stacked body composed of the single crystal substrate, the first intermediate layer stacked on the single crystal substrate, the first electrode layer stacked on the first intermediate layer, the piezoelectric thin film stacked on the first electrode layer, and the second electrode layer stacked on the piezoelectric thin film was prepared by the above-described process. In the subsequent photolithography, patterning of a stacked structure on the single crystal substrate was performed. After the patterning, the stacked body was cut by dicing.

A rectangular piezoelectric thin film element of Example 1 was obtained by the above-described process. The piezoelectric thin film element was composed of the single crystal substrate, the first intermediate layer stacked on the single crystal substrate, the first electrode layer stacked on the first intermediate layer, the piezoelectric thin film stacked on the first electrode layer, and the second electrode layer stacked on the piezoelectric thin film. An area of a movable portion of the piezoelectric thin film was 20 mm×1.0 mm.

<Evaluation of Piezoelectric Properties>

Piezoelectric properties of the piezoelectric thin film were evaluated by the following method.

[Measurement of Residual Polarization]

A polarization hysteresis of the piezoelectric thin film was measured. In the measurement, an apparatus in which an atomic force microscope (AFM) and a ferroelectric substance evaluation system are combined was used. The atomic force microscope was SPA-400 manufactured by Seiko Instruments Inc. The ferroelectric substance evaluation system was FCE manufactured by TOYO Corporation. A frequency of an AC voltage in the measurement of the hysteresis was 5 Hz. A maximum value of a voltage applied to the piezoelectric thin film in the measurement was 20 V. A residual polarization Pr of the piezoelectric thin film was shown in the following Table 2. A unit of the residual polarization Pr is $\mu C/cm^2$.

[Calculation of Relative Permittivity]

An electrostatic capacitance C of the piezoelectric thin film element was measured. Details of measurement of the electrostatic capacitance C were as follows.

Measurement device: Impedance Gain-Phase Analyzer 4194A manufactured by Hewlett Packard Enterprise Development LP Frequency: 10 kHz Electric field: 0.1 V/µm Relative permittivity $\varepsilon_r$ was calculated from the measured value of the electrostatic capacitance C on the basis of the following Mathematical Formula A. $\varepsilon_r$ in Example 1 is shown in the following Table 2.

$$C = \varepsilon_0 \times \varepsilon_r \times (S/d) \tag{A}$$

$\varepsilon_0$ in Mathematical Formula A is vacuum permittivity ($8.854 \times 10^{-12}$ Fm$^{-1}$). S in Mathematical Formula A is an area of the surface of the piezoelectric thin film. S may be referred to as an area of the first electrode layer stacked on the piezoelectric thin film. d in Mathematical Formula A is the thickness of the piezoelectric thin film.

[Measurement of Piezoelectric Constant $-e_{31,f}$]

To measure the piezoelectric constant $-e_{31,f}$ of the piezoelectric thin film, a rectangular sample (cantilever) was prepared as the piezoelectric thin film element. Dimensions of the sample were 3 mm (width)×15 mm (length). The sample was the same as the piezoelectric thin film element except for the dimensions. In measurement, a self-made evaluation system was used. One end of the sample was fixed, and the other end of the sample was a free end. A displacement amount of the free end of the sample was measured by a laser while applying a voltage to the piezoelectric thin film in the sample. In addition, the piezoelectric constant $-e_{31,f}$ was calculated from the following Mathematical Formula B. $E_s$ in Mathematical Formula B is Young's modulus of the single crystal substrate, $h_s$ is the thickness of the single crystal substrate. L is a length of the sample (cantilever). $v_s$ is a Poisson's ratio of the single crystal substrate. $\delta_{out}$ an output displacement based on the measured displacement amount. $V_{in}$ is a voltage applied to the piezoelectric thin film. A frequency of an AC electric field (AC voltage) in the measurement of the piezoelectric constant $-e_{31,f}$ was 100 Hz. A maximum value of the voltage applied to the piezoelectric thin film was 50 V. A unit of $-e_{31,f}$ is C/m$^2$. $-e_{31,f}$ in Example 1 is shown in the following Table 2. $(-e_{31,f})^2/\varepsilon_0\varepsilon_r$ (piezoelectric performance index) in Example 1 is shown in the following Table 2.

[Mathematical Formula 1]

$$-e_{31,f} = \frac{E_s h_s^2}{3L^2(1-v_s)} \cdot \frac{\delta_{out}}{V_{in}} \tag{B}$$

Examples 2 to 6 and Comparative Examples 1 to 3

The composition of the first target in each of Examples 2 to 6 and Comparative Example 1 to 3 was different from the composition of the first target in Example 1. The composition of the first target in each of Examples 2 to 6 and Comparative Examples 1 to 3 is expressed by the following Chemical Formula 1'. $E^A$, $E^{B1}$, and $E^{B2}$ in Chemical Formula 1' in each of Examples 2 to 6 and Comparative Examples 1 to 3 are shown in the following Table 1. $\alpha$, $\beta$, x1 and z1 in Chemical Formula 1' in each of Examples 2 to 6 and Comparative Examples 1 to 3 are shown in the following Table 1.

$$x1(Bi_{1-\beta}E^A{}_\beta)(E^{B1}{}_{1-\beta}E^{B2}{}_\beta)O_3\text{---}y1BiFeO_3\text{-}z1Bi(Fe_{0.5}Ti_{0.5})O_3 \tag{1'}$$

The composition of the second target in each of Examples 2 to 6 and Comparative Examples 1 to 3 was different from the composition of the second target in Example 1. The composition of the second target in each of Examples 2 to 6 and Comparative Examples 1 to 3 is expressed by the following Chemical Formula 2'. $E^A$, $E^{B1}$, and $E^{B2}$ in Chemical Formula 2" in each of Examples 2 to 6 and Comparative Examples 1 to 3 are shown in the following Table 1. $\alpha$, $\beta$, x2, y2, and z2 in Chemical Formula 2' in each of Examples 2 to 6 and Comparative Examples 1 to 3 are shown in the following Table 1. In any of Examples 2 to 6 and Comparative Examples 1 to 3, $E^A$, $E^{B1}$, $E^{B2}$, $\alpha$, and $\beta$ are common to Chemical Formula 1' (first target) and the following Chemical Formula 2' (second target).

$$x2(Bi_{1-\alpha}E^A{}_\alpha)(E^{B1}{}_{1-\beta}E^{B2}{}_\beta)O_3\text{---}y2BiFeO_3\text{-}z2Bi(FeO_{0.5}Ti_{0.5})O_3 \tag{2'}$$

In a case of Comparative Example 1, the repetition frequency f1 of the pulsed-laser light in the first film formation step was adjusted to 10 Hz. The composition of the second target in Comparative Example 1 was the same as the composition of the first target in Comparative Example 1, and the composition of the piezoelectric thin film in Comparative Example 1 was uniform.

The thickness Ta of the first piezoelectric layer in each of Examples 2 to 6 and Comparative Examples 2 and 3 was adjusted to a value shown in the following Table 2. The thickness Tb of the second piezoelectric layer in each of Examples 2 to 6 and Comparative Examples 2 and 3 was adjusted to a value shown in the following Table 2. The thickness Tp of the piezoelectric thin film in each of Examples 2 to 6 and Comparative Examples 1 to 3 was a value shown in the following Table 2.

A piezoelectric thin film element of each of Examples 2 to 6 and Comparative Examples 1 to 3 was prepared by the same method as in Example 1 except for the above-described matters.

XRD patterns of the first electrode layer in each of Examples 2 to 6 and Comparative Examples 1 to 3 were measured by the same method as in Example 1. In any of Examples 2 to 6 and Comparative Examples 1 to 3, the (002) plane of the Pt crystal constituting the first electrode layer was oriented in a normal direction of the surface of the first electrode layer, and the (200) plane of the Pt crystal was oriented in an in-plane direction of the surface of the first electrode layer.

The composition of the piezoelectric thin film in each of Examples 2 to 6 and Comparative Examples 1 to 3 was analyzed by the same method as in Example 1. In any of Examples 2 to 6 and Comparative Examples 2 and 3, the composition of the first piezoelectric layer matched the composition of the first target, and the composition of the second piezoelectric layer matched the composition of the second target. In a case of Comparative Example 1, the uniform composition of the piezoelectric thin film matched the composition of each of the first target and the second target.

Analysis of the piezoelectric thin film in each of Examples 2 to 6 and Comparative Examples 1 to 3 was performed by the same method as in Example 1 by using the X-ray diffraction apparatus and the STEM. The piezoelectric thin film in each of Examples 2 to 6 and Comparative Examples 1 to 3 had the following characteristics.

In any of Examples 2 to 6 and Comparative Example 2, the first piezoelectric layer consisted of the tetragonal crystal 1 of the perovskite-type oxide.

In any of Examples 2 to 6 and Comparative Example 2, the second piezoelectric layer consisted of the tetragonal crystal 2 of the perovskite-type oxide.

In a case of Comparative Example 1, the tetragonal crystal 1 of the perovskite-type oxide and the tetragonal crystal 2 of the perovskite-type oxide coexisted in the piezoelectric thin film having a uniform composition.

In any of Examples 2 to 6 and Comparative Examples 1 and 2, the (001) plane of the tetragonal crystal 1 was preferentially oriented in the normal direction of the surface of the piezoelectric thin film.

In any of Examples 2 to 6 and Comparative Examples 1 and 2, the (001) plane of the tetragonal crystal 2 was preferentially oriented in the normal direction of the surface of the piezoelectric thin film.

c1/a1 of the tetragonal crystal 1 in each of Examples 2 to 6 and Comparative Examples 1 and 2 was a value shown in the following Table 2.

c2/a2 of the tetragonal crystal 2 in each of Examples 2 to 6 and Comparative Examples 1 and 2 was a value shown in the following Table 2.

$I_2/(I_1+I_2)$ in each of Examples 2 to 6 and Comparative Examples 1 and 2 was a value shown in the following Table 2.

In analysis of the piezoelectric thin film of Comparative Example 3, two kinds of tetragonal crystals different in anisotropy (c/a) were not detected, and only one kind of tetragonal crystal consisting of a perovskite-type oxide was specified. That is, in a case of Comparative Example 3, it was difficult to distinguish a diffracted X-ray deriving from the crystal structure of the first piezoelectric layer and a diffracted X-ray deriving from the crystal structure of the second piezoelectric layer, and it was difficult to specify a difference between the first piezoelectric layer and the second piezoelectric layer in a crystal structure. The (001) plane of the tetragonal crystal in Comparative Example 3 was preferentially oriented in the normal direction of the surface of the piezoelectric thin film. Only one value (1.037) was specified as c/a of the tetragonal crystal in Comparative Example 3. The results of the analyses in Comparative Example 3 implied that c1/a1 of the tetragonal crystal 1 constituting the first piezoelectric layer is the same as c2/a2 of the tetragonal crystal 2 constituting the second piezoelectric layer.

The piezoelectric properties of the piezoelectric thin film in each of Examples 2 to 6 and Comparative Examples 1 to 3 were evaluated by the same method as in Example 1.

Pr in each of Examples 2 to 6 and Comparative Examples 1 to 3 is shown in the following Table 2.

$\varepsilon_r$ in each of Examples 2 to 6 and Comparative Examples 1 to 3 is shown in the following Table 2.

$-e_{31,f}$ in each of Examples 2 to 6 and Comparative Examples 1 to 3 is shown in the following Table 2.

$(-e_{31,f})^2/\varepsilon_0\varepsilon_r$ in each of Examples 2 to 6 and Comparative Examples 1 to 3 is shown in the following Table 2.

TABLE 1

| | f1 | $E^A$ | $E^{B1}$ | $E^{B2}$ | α | β | x1 | y1 | z1 | f2 | x2 | y2 | z2 | Orientated plane |
|---|---|---|---|---|---|---|---|---|---|---|---|---|---|---|
| Unit | Hz | — | — | — | — | — | — | — | — | Hz | — | — | — | — |
| Example 1 | 20 | K | Ti | None | 0.5 | 0 | 0.15 | 0.80 | 0.05 | 10 | 0.10 | 0.85 | 0.05 | (001) |
| Example 2 | 20 | Ag | Mg | Ti | 0.5 | 0.5 | 0.15 | 0.05 | 0.80 | 10 | 0.10 | 0.10 | 0.80 | (001) |
| Example 3 | 20 | K | Zn | Zr | 0.5 | 0.5 | 0.85 | 0.10 | 0.05 | 10 | 0.80 | 0.15 | 0.05 | (001) |
| Example 4 | 20 | None | Al | None | 0 | 0 | 0.20 | 0.10 | 0.70 | 10 | 0.15 | 0.15 | 0.70 | (001) |
| Example 5 | 20 | Na | Ni | Ti | 0.5 | 0.5 | 0.25 | 0.15 | 0.60 | 10 | 0.20 | 0.20 | 0.60 | (001) |
| Example 6 | 20 | None | Mg | Ti | 0 | 0.5 | 0.15 | 0.35 | 0.50 | 10 | 0.10 | 0.40 | 0.50 | (001) |
| Comparative Example 1 | 10 | K | Zn | Ti | 0.5 | 0.5 | 0.10 | 0.90 | 0.00 | 10 | 0.10 | 0.90 | 0.00 | (001) |
| Comparative Example 2 | 20 | K | Ti | None | 0.5 | 0 | 0.10 | 0.00 | 0.90 | 10 | 0.10 | 0.05 | 0.85 | (001) |
| Comparative Example 3 | 20 | K | Ti | None | 0.5 | 0 | 1.00 | 0.00 | 0.00 | 10 | 0.95 | 0.05 | 0.00 | (001) |

TABLE 2

| | Pr | $\varepsilon_r$ | $-e_{31,f}$ | $(-e_{31,f})^2/\varepsilon_0\varepsilon_r$ | $I_2/(I_1 + I_2)$ | c2/a2 | c1/a1 | Ta | Tb | Tp |
|---|---|---|---|---|---|---|---|---|---|---|
| Unit | μC/cm² | — | C/m² | GPa | — | — | — | nm | nm | nm |
| Example 1 | 91 | 97 | 8.1 | 76.4 | 0.93 | 1.235 | 1.048 | 150 | 2850 | 3000 |
| Example 2 | 96 | 88 | 7.5 | 72.2 | 0.92 | 1.193 | 1.032 | 220 | 2000 | 2220 |
| Example 3 | 105 | 78 | 7.1 | 73.0 | 0.91 | 1.122 | 1.015 | 300 | 3500 | 3800 |
| Example 4 | 85 | 99 | 7.9 | 71.2 | 0.97 | 1.062 | 1.031 | 120 | 4800 | 4920 |
| Example 5 | 95 | 84 | 7.5 | 75.6 | 0.95 | 1.051 | 1.024 | 190 | 1500 | 1690 |

TABLE 2-continued

| | Pr | $\varepsilon_r$ | $-e_{31,f}$ | $(-e_{31,f})^2/\varepsilon_0\varepsilon_r$ | $I_2/(I_1+I_2)$ | c2/a2 | c1/a1 | Ta | Tb | Tp |
|---|---|---|---|---|---|---|---|---|---|---|
| Example 6 | 90 | 87 | 7.5 | 73.0 | 0.99 | 1.058 | 1.019 | 80 | 500 | 580 |
| Comparative Example 1 | 120 | 95 | 1.8 | 3.9 | 0.95 | 1.191 | 1.052 | — | — | 2700 |
| Comparative Example 2 | 20 | 300 | 1.9 | 1.4 | 0.89 | 1.059 | 1.055 | 90 | 2100 | 2190 |
| Comparative Example 3 | 40 | 150 | 2.2 | 3.6 | — | 1.037 | 1.037 | 50 | 2000 | 2050 |

Comparative Example 4

As illustrated in the following Table 3, the composition of the first target in Comparative Example 4 was the same as the composition of the first target in Example 1, and the composition of the second target in Comparative Example 4 was the same as the composition of the second target in Example 1.

The oxygen partial pressure in the vacuum chamber in the first film formation step and the second film formation step in Comparative Example 4 was maintained at 0.01 Pa.

The thickness Ta of the first piezoelectric layer in Comparative Example 4 was adjusted to a value shown in the following Table 4. The thickness Tb of the second piezoelectric layer in Comparative Example 4 was adjusted to a value shown in the following Table 4. The thickness Tp of the piezoelectric thin film in Comparative Example 4 was a value shown in the following Table 4.

A piezoelectric thin film element in Comparative Example 4 was prepared by the same method as in Example 1 except for the above-described matters.

XRD patterns of the first electrode layer in Comparative Example 4 were measured by the same method as in Example 1. In a case of Comparative Example 4, the (002) plane of the Pt crystal constituting the first electrode layer was oriented in a normal direction of the surface of the first electrode layer, and the (200) plane of the Pt crystal was oriented in an in-plane direction of the surface of the first electrode layer.

The composition of the piezoelectric thin film in Comparative Example 4 was analyzed by the same method as in Example 1. In a case of Comparative Example 4, the composition of the piezoelectric thin film did not match the composition of each of the first target and the second target in terms of a content of oxygen.

Analysis of the piezoelectric thin film in Comparative Example 4 was performed by the same method as in Example 1 by using the X-ray diffraction apparatus and the STEM. Since the piezoelectric thin film in Comparative Example 4 did not have crystallinity and crystal orientation, it was difficult to specify c1/a1, c2/a2, and $I_2/(I_1+I_2)$ in Comparative Example 3.

The piezoelectric properties of the piezoelectric thin film in Comparative Example 4 were evaluated by the same method as in Example 1.

Pr in Comparative Example 4 is shown in the following Table 4.

$\varepsilon_r$ in Comparative Example 4 is shown in the following Table 4.

$-e_{31,f}$ in Comparative Example 4 is shown in the following Table 4.

$(-e_{31,f})^2/\varepsilon_0\varepsilon_r$ in Comparative Example 4 is shown in the following Table 4.

TABLE 3

| | f1 | $E^A$ | $E^{B1}$ | $E^{B2}$ | α | β | x1 | y1 | z1 | f2 | x2 | y2 | z2 | Orientated plane |
|---|---|---|---|---|---|---|---|---|---|---|---|---|---|---|
| Unit | Hz | — | — | — | — | — | — | — | — | Hz | — | — | — | — |
| Example 1 | 20 | K | Ti | None | 0.5 | 0 | 0.15 | 0.80 | 0.05 | 10 | 0.10 | 0.85 | 0.05 | (001) |
| Comparative Example 4 | 20 | K | Ti | None | 0.5 | 0 | 0.15 | 0.80 | 0.05 | 10 | 0.10 | 0.85 | 0.05 | None |

TABLE 4

| | Pr | $\varepsilon_r$ | $-e_{31,f}$ | $(-e_{31,f})^2/\varepsilon_0\varepsilon_r$ | $I_2/(I_1+I_2)$ | c2/a2 | c1/a1 | Ta | Tb | Tp |
|---|---|---|---|---|---|---|---|---|---|---|
| Unit | μC/cm² | — | C/m² | GPa | — | — | — | nm | nm | nm |
| Example 1 | 91 | 97 | 8.1 | 76.4 | 0.93 | 1.235 | 1.048 | 150 | 2850 | 3000 |
| Comparative Example 4 | 36 | 358 | 1.0 | 0.3 | — | — | — | 30 | 2500 | 2530 |

Examples 7 and 8

As illustrated in the following Table 5, the composition of the first target in each of Examples 7 and 8 was the same as the composition of the first target in Example 1, and the composition of the second target in each of Examples 7 and 8 was the same as the composition of the second target in Example 1.

In a case of Examples 7 and 8, the second intermediate layer was formed on the entirety of the surface of the first electrode layer, and the first piezoelectric layer was formed on the entirety of the surface of the second intermediate layer.

The second intermediate layer in Example 7 consisted of crystalline $SrRuO_3$. The thickness of the second intermediate layer in Example 7 was 50 nm. "SRO" in the following Table 5 represents $SrRuO_3$.

The second intermediate layer in Example 8 consisted of crystalline $LaNiO_3$. The thickness of the second intermediate layer in Example 8 was 50 nm. "LNO" in the following Table 5 represents $LaNiO_3$.

The thickness Ta of the first piezoelectric layer in each of Examples 7 and 8 was adjusted to a value shown in the following Table 6. The thickness Tb of the second piezoelectric layer in each of Examples 7 and 8 was adjusted to a value shown in the following Table 6. The thickness Tp of the piezoelectric thin film in each of Examples 7 and 8 was a value shown in the following Table 6.

A piezoelectric thin film element in each of Examples 7 and 8 was prepared by the same method as in Example 1 except for the above-described matters.

c1/a1 of the tetragonal crystal 1 in each of Examples 7 and 8 was a value shown in the following Table 6.

c2/a2 of the tetragonal crystal 2 in each of Examples 7 and 8 was a value shown in the following Table 6.

$I_2/(I_1+I_2)$ in each of Examples 7 and 8 was a value shown in the following Table 6.

The piezoelectric properties of the piezoelectric thin film in each of Examples 7 and 8 were evaluated by the same method as in Example 1.

Pr in each of Examples 7 and 8 is shown in the following Table 6.

$\varepsilon_r$ in each of Examples 7 and 8 is shown in the following Table 6.

$-e_{31,f}$ in each of Examples 7 and 8 is shown in the following Table 6.

$(-e_{31,f})^2/\varepsilon_0\varepsilon_r$ in each of Examples 7 and 8 is shown in the following Table 6.

TABLE 5

|  | f1 | $E^A$ | $E^{B1}$ | $E^{B2}$ | α | β | x1 | y1 | z1 | f2 | x2 | y2 | z2 | Orientated plane | Second intermediate layer |
|---|---|---|---|---|---|---|---|---|---|---|---|---|---|---|---|
| Unit | Hz | — | — | — | — | — | — | — | — | Hz | — | — | — | — | — |
| Example 1 | 20 | K | Ti | None | 0.5 | 0 | 0.15 | 0.80 | 0.05 | 10 | 0.10 | 0.85 | 0.05 | (001) | None |
| Example 7 | 20 | K | Ti | None | 0.5 | 0 | 0.15 | 0.80 | 0.05 | 10 | 0.10 | 0.85 | 0.05 | (001) | SRO |
| Example 8 | 20 | K | Ti | None | 0.5 | 0 | 0.15 | 0.80 | 0.05 | 10 | 0.10 | 0.85 | 0.05 | (001) | LNO |

TABLE 6

|  | Pr | $\varepsilon_r$ | $-e_{31,f}$ | $(-e_{31,f})^2/\varepsilon_0\varepsilon_r$ | $I_2/(I_1+I_2)$ | c2/a2 | c1/a1 | Ta | Tb | Tp |
|---|---|---|---|---|---|---|---|---|---|---|
| Unit | μC/cm² | — | C/m² | GPa | — | — | — | nm | nm | nm |
| Example 1 | 91 | 97 | 8.1 | 76.4 | 0.93 | 1.235 | 1.048 | 150 | 2850 | 3000 |
| Example 7 | 95 | 99 | 8.3 | 78.6 | 0.95 | 1.210 | 1.042 | 170 | 2830 | 3000 |
| Example 8 | 110 | 95 | 7.8 | 72.3 | 0.95 | 1.249 | 1.050 | 120 | 2880 | 3000 |

XRD patterns of the first electrode layer in each of Examples 7 and 8 were measured by the same method as in Example 1. In any of Examples 7 and 8, the (002) plane of the Pt crystal constituting the first electrode layer was oriented in the normal direction of the surface of the first electrode layer, and the (200) plane of the Pt crystal was oriented in an in-plane direction of the surface of the first electrode layer.

The composition of the piezoelectric thin film in each of Examples 7 and 8 was analyzed by the same method as in Example 1. In any of Examples 7 and 8, the composition of the first piezoelectric layer matched the composition of the first target, and the composition of the second piezoelectric layer matched the composition of the second target.

Analysis of the piezoelectric thin film in each of Examples 7 and 8 was performed by the same method as in Example 1 by using the X-ray diffraction apparatus and the STEM. The piezoelectric thin film in each of Examples 7 and 8 had the following characteristics.

The first piezoelectric layer consisted of the perovskite-type tetragonal crystal 1.

The second piezoelectric layer consisted of the perovskite-type tetragonal crystal 2.

The (001) plane of the tetragonal crystal 1 was preferentially oriented in the normal direction of the surface of the piezoelectric thin film.

The (001) plane of the tetragonal crystal 2 was preferentially oriented in the normal direction of the surface of the piezoelectric thin film.

Example 9

As illustrated in the following Table 7, the composition of the first target in Example 9 was the same as the composition of the first target in Example 1, and the composition of the second target in Example 9 was the same as the composition of the second target in Example 1.

In a process of preparing a piezoelectric thin film element in Example 9, the first intermediate layer was not formed. In the process of preparing the piezoelectric thin film element in Example 9, the first electrode layer consisting of crystalline $SrRuO_3$ was directly formed on the entirety of the surface of the single crystal substrate. The thickness of the first electrode layer in Example 9 was 200 nm.

The thickness Ta of the first piezoelectric layer in Example 9 was adjusted to a value shown in the following Table 8. The thickness Tb of the second piezoelectric layer in Example 9 was adjusted to a value shown in the following Table 8. The thickness Tp of the piezoelectric thin film in Example 9 was a value shown in the following Table 8.

A piezoelectric thin film element in Example 9 was prepared by the same method as in Example 1 except for the above-described matters.

XRD patterns of the first electrode layer in Example 9 were measured by the same method as in Example 1. In-plane orientation of the crystal of the first electrode layer in Example 9 was evaluated by the same in-plane measurement as in Example 1. In a case of Example 9, a crystal plane of the first electrode layer was not oriented in the in-plane direction of the surface of the first electrode layer. That is, in a case of Example 9, the in-plane orientation of the crystal of the first electrode layer did not exist.

The composition of the piezoelectric thin in Example 9 was analyzed by the same method as in Example 1. In a case of Example 9, the composition of the first piezoelectric layer matched the composition of the first target, and the composition of the second piezoelectric layer matched the composition of the second target.

Analysis of the piezoelectric thin film in Example 9 was performed by the same method as in Example 1 by using the X-ray diffraction apparatus and the STEM. The piezoelectric thin film in Example 9 had the following characteristics.

The first piezoelectric layer consisted of the perovskite-type tetragonal crystal 1.

The second piezoelectric layer consisted of the perovskite-type tetragonal crystal 2.

The (001) plane of the tetragonal crystal 1 was preferentially oriented in the normal direction of the surface of the piezoelectric thin film.

The (001) plane of the tetragonal crystal 2 was preferentially oriented in the normal direction of the surface of the piezoelectric thin film.

c1/a1 of the tetragonal crystal 1 in Example 9 was a value shown in the following Table 8.

c2/a2 of the tetragonal crystal 2 in Example 9 was a value shown in the following Table 8.

$I_2/(I_1+I_2)$ in Example 9 was a value shown in the following Table 8.

The piezoelectric properties of the piezoelectric thin film in Example 9 were evaluated by the same method as in Example 1.

Pr in Example 9 is shown in the following Table 8.

$\varepsilon_r$ in Example 9 is shown in the following Table 8.

$-e_{31,f}$ in Example 9 is shown in the following Table 8.

$(-e_{31,f})^2/\varepsilon_0\varepsilon_r$ in Example 9 is shown in the following Table 8.

piezoelectric thin film, 3A: first piezoelectric layer, 3B: second piezoelectric layer, 4: second electrode layer, 5: first intermediate layer, 6: second intermediate layer, $D_N$: normal direction of surface of single crystal substrate, dn: normal direction of surface of piezoelectric thin film, uc: unit cell of perovskite structure, uc1: unit cell of tetragonal crystal 1, uc2: unit cell of tetragonal crystal 2.

What is claimed is:

1. A piezoelectric thin film, comprising:
   a first piezoelectric layer; and
   a second piezoelectric layer that is directly stacked on the first piezoelectric layer,
   wherein the first piezoelectric layer contains a tetragonal crystal 1 of a perovskite-type oxide,
   the second piezoelectric layer contains a tetragonal crystal 2 of a perovskite-type oxide,
   a (001) plane of the tetragonal crystal 1 is oriented in a normal direction of a surface of the piezoelectric thin film,
   a (001) plane of the tetragonal crystal 2 is oriented in the normal direction of the surface of the piezoelectric thin film,
   an interval of the (001) plane of the tetragonal crystal 1 is set as c1,
   an interval of a (100) plane of the tetragonal crystal 1 is set as a1,
   an interval of the (001) plane of the tetragonal crystal 2 is set as c2,
   an interval of a (100) plane of the tetragonal crystal 2 is set as a2,
   c2/a2 is more than c1/a1, and
   c1/a1 is from 1.015 to 1.050.

2. The piezoelectric thin film according to claim 1, wherein c2/a2 is from 1.051 to 1.250.

3. The piezoelectric thin film according to claim 1, wherein a peak intensity of a diffracted X-ray deriving from the (001) plane of the tetragonal crystal 1 is set as $I_1$,

TABLE 7

|  | f1 | $E^A$ | $E^{B1}$ | $E^{B2}$ | α | β | x1 | y1 | z1 | f2 | x2 | y2 | z2 | Orientated plane | In-plane orientation |
|---|---|---|---|---|---|---|---|---|---|---|---|---|---|---|---|
| Unit | Hz | — | — | — | — | — | — | — | — | Hz | — | — | — | — | — |
| Example 1 | 20 | K | Ti | None | 0.5 | 0 | 0.15 | 0.80 | 0.05 | 10 | 0.10 | 0.85 | 0.05 | (001) | Present |
| Example 9 | 10 | K | Ti | None | 0.5 | 0 | 0.15 | 0.80 | 0.05 | 10 | 0.10 | 0.85 | 0.05 | (001) | Absent |

TABLE 8

|  | Pr | $\varepsilon_r$ | $-e_{31,f}$ | $(-e_{31,f})^2/\varepsilon_0\varepsilon_r$ | $I_2/(I_1+I_2)$ | c2/a2 | c1/a1 | Ta | Tb | Tp |
|---|---|---|---|---|---|---|---|---|---|---|
| Unit | μC/cm² | — | C/m² | Gpa | — | — | — | nm | nm | nm |
| Example 1 | 91 | 97 | 8.1 | 76.4 | 0.93 | 1.235 | 1.048 | 150 | 2850 | 3000 |
| Example 9 | 85 | 117 | 7.5 | 54.3 | 0.95 | 1.155 | 1.023 | 110 | 2890 | 3000 |

INDUSTRIAL APPLICABILITY

For example, the piezoelectric thin film related to an aspect of the present invention is applicable to a piezoelectric transducer, a piezoelectric actuator, and a piezoelectric sensor.

REFERENCE SIGNS LIST

10: piezoelectric thin film element, 10a: ultrasonic transducer, 1: single crystal substrate, 2: first electrode layer, 3:

a peak intensity of a diffracted X-ray deriving from the (001) plane of the tetragonal crystal 2 is set as $I_2$, and
$I_2/(I_1+I_2)$ is 0.90 or more and less than 1.00.

4. The piezoelectric thin film according to claim 1,
   wherein the perovskite-type oxide contains bismuth, iron, an element $E^B$, and oxygen, and
   the element $E^B$ is at least one kind of element selected from the group consisting of magnesium, aluminum, zirconium, titanium, nickel, and zinc.

5. The piezoelectric thin film according to claim 1,
wherein the tetragonal crystal 1 is expressed by the following chemical formula 1,
$E^A$ in the following chemical formula 1 is at least one kind of element selected from the group consisting of Na, K, and Ag,
$E^B$ in the following chemical formula 1 is at least one kind of element selected from the group consisting of Mg, Al, Zr, Ti, Ni, and Zn,
x1 in the following chemical formula 1 is from 0.10 to 0.90,
y1 in the following chemical formula 1 is from 0.05 to 0.85,
z1 in the following chemical formula 1 is from 0.05 to 0.85,
x1+y1+z1 is 1.00, and
α in the following chemical formula 1 is 0.00 or more and less than 1.00, $$x1(Bi_{1-\alpha}E^A_\alpha)E^B O_3 - y1 BiFeO_3 - z1 Bi(Fe_{0.5}Ti_{0.5})O_3 \quad (1).$$

6. The piezoelectric thin film according to claim 1,
wherein the tetragonal crystal 2 is expressed by the following chemical formula 2,
$E^A$ in the following chemical formula 2 is at least one kind of element selected from the group consisting of Na, K, and Ag,
$E^B$ in the following chemical formula 2 is at least one kind of element selected from the group consisting of Mg, Al, Zr, Ti, Ni, and Zn,
x2 in the following chemical formula 2 is from 0.10 to 0.85,
y2 in the following chemical formula 2 is from 0.10 to 0.85,
z2 in the following chemical formula 2 is from 0.05 to 0.80,
x2+y2+z2 is 1.00, and
α a in the following chemical formula 2 is 0.00 or more and less than 1.00, $$x2(Bi_{1-\alpha}E^A_\alpha)E^B O_3 - y2 BiFeO_3 - z2 Bi(Fe_{0.5}Ti_{0.5})O_3 \quad (2).$$

7. The piezoelectric thin film according to claim 1,
wherein the thickness of the first piezoelectric layer is from 10 nm to 300 nm.

8. A piezoelectric thin film element comprising:
the piezoelectric thin film according to claim 1.

9. The piezoelectric thin film element according to claim 8, comprising:
a single crystal substrate;
an electrode layer that is stacked on the single crystal substrate; and
the piezoelectric thin film that is stacked on the electrode layer,
wherein a first intermediate layer is disposed between the single crystal substrate and the electrode layer, and
the first intermediate layer contains $ZrO_2$ and $Y_2O_3$.

10. The piezoelectric thin film element according to claim 8, comprising:
an electrode layer; and
the piezoelectric thin film that is staked on the electrode layer,
wherein a second intermediate layer is disposed between the electrode layer and the piezoelectric thin film, and
the second intermediate layer contains at least one of $SrRuO_3$ and $LaNiO_3$.

11. The piezoelectric thin film element according to claim 8, comprising:
an electrode layer; and
the piezoelectric thin film that is stacked on the electrode layer,
wherein the electrode layer contains a platinum crystal,
a (002) plane of the platinum crystal is oriented in a normal direction of a surface of the electrode layer, and
a (200) plane of the platinum crystal is oriented in an in-plane direction of the surface of the electrode layer.

12. A piezoelectric transducer, comprising:
the piezoelectric thin film element according to claim 8.

* * * * *